(12) United States Patent
Tago et al.

(10) Patent No.: US 9,401,532 B2
(45) Date of Patent: Jul. 26, 2016

(54) HIGH-FREQUENCY SIGNAL LINE AND ELECTRONIC DEVICE INCLUDING THE SAME

(71) Applicant: Murata Manufacturing Co., Ltd., Nagaokakyo-shi, Kyoto-fu (JP)

(72) Inventors: Shigeru Tago, Nagaokakyo (JP); Satoshi Sasaki, Nagaokakyo (JP); Noboru Kato, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 218 days.

(21) Appl. No.: 14/191,605

(22) Filed: Feb. 27, 2014

(65) Prior Publication Data
US 2014/0176264 A1 Jun. 26, 2014

Related U.S. Application Data

(63) Continuation of application No. PCT/JP2012/079094, filed on Nov. 9, 2012.

(30) Foreign Application Priority Data

Nov. 10, 2011 (JP) .................. 2011-246380
Jan. 31, 2012 (JP) .................. 2012-018230

(51) Int. Cl.
*H01P 3/08* (2006.01)
*H05K 1/02* (2006.01)
*H05K 1/14* (2006.01)
*H05K 3/46* (2006.01)
*H01P 5/02* (2006.01)

(52) U.S. Cl.
CPC *H01P 3/08* (2013.01); *H01P 3/081* (2013.01); *H05K 1/028* (2013.01); *H05K 1/0225* (2013.01); *H05K 1/0253* (2013.01); *H01P 5/028* (2013.01); *H05K 1/147* (2013.01); *H05K 3/4635* (2013.01); *H05K 2201/0191* (2013.01); *H05K 2201/09309* (2013.01); *H05K 2201/09618* (2013.01); *H05K2201/09727* (2013.01); *H05K 2201/10037* (2013.01)

(58) Field of Classification Search
CPC ................................. H01P 3/08; H03H 7/38
USPC ..................... 333/238, 246, 33, 34
See application file for complete search history.

(56) References Cited

U.S. PATENT DOCUMENTS

2004/0012458 A1* 1/2004 Amparan .................. H01P 5/02
                                                                    333/34

FOREIGN PATENT DOCUMENTS

| JP | 2002-237221 A | 8/2002 |
| JP | 2007-123740 A | 5/2007 |
| JP | 2011-071403 A | 4/2011 |

OTHER PUBLICATIONS

Official Communication issued in International Patent Application No. PCT/JP2012/079094, mailed on Dec. 18, 2012.
Official Communication issued in corresponding Japanese Patent Application No. 2013-543038, mailed on Jan. 7, 2014.

* cited by examiner

*Primary Examiner* — Stephen E Jones
(74) *Attorney, Agent, or Firm* — Keating & Bennett, LLP

(57) ABSTRACT

A high-frequency signal line includes a dielectric element body including regions and a plurality of flexible dielectric sheets. A signal conductive layer is provided in or on the dielectric element body. Ground conductive layers are provided in or on the dielectric element body and face the signal conductive layer. A distance between the ground conductive layer and the signal conductive layer in the region is smaller than a distance between the ground conductive layer and the signal conductive layer in the regions. The dielectric element body is bent in the region.

18 Claims, 20 Drawing Sheets

F I G . 1
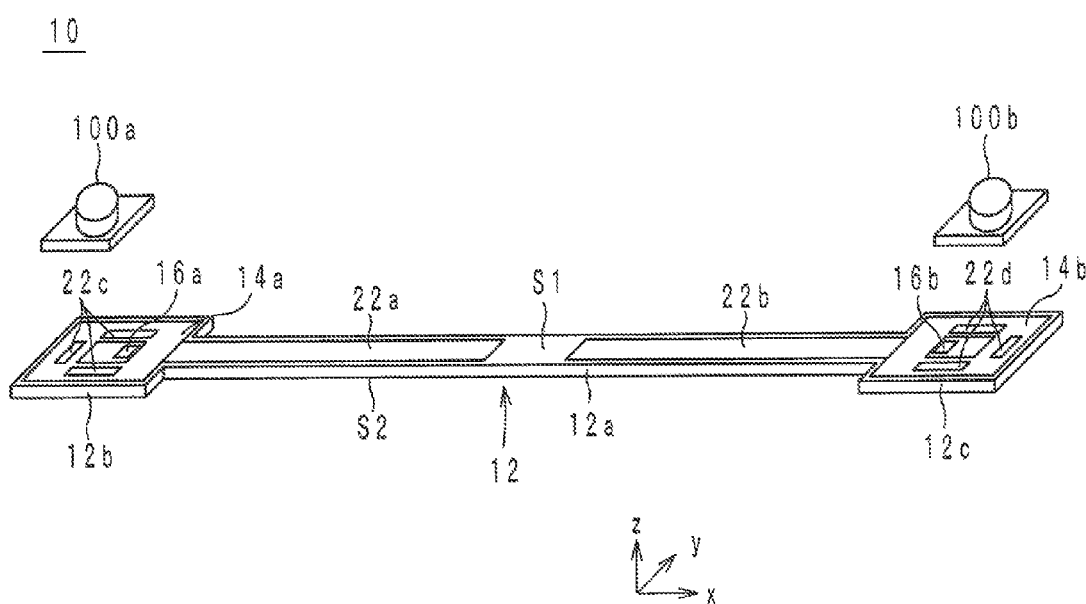

F I G. 2
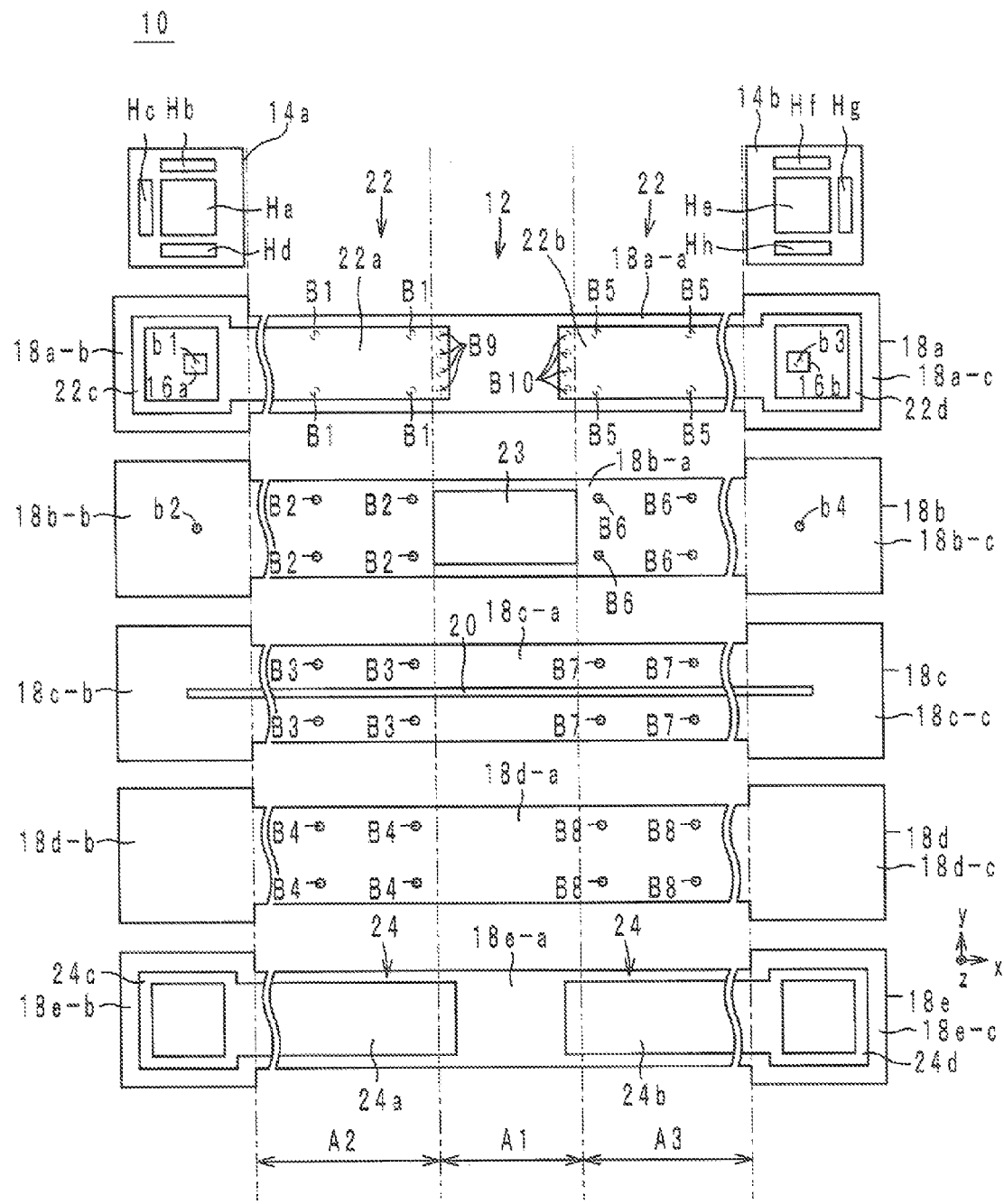

F I G. 4 A
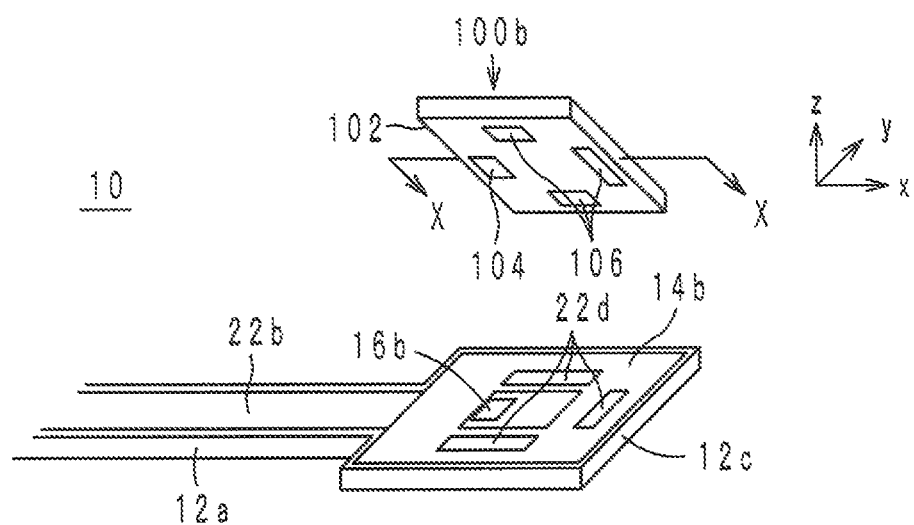
F I G. 4 B
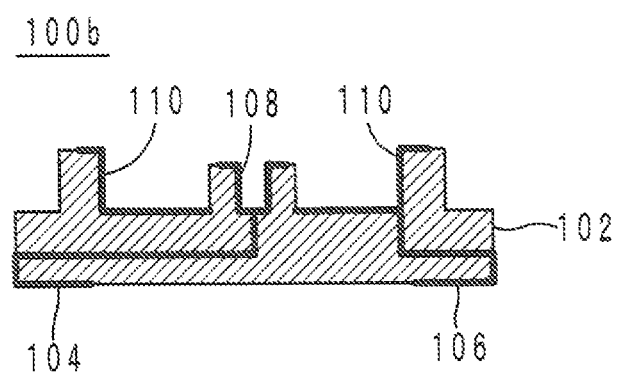

F I G. 10
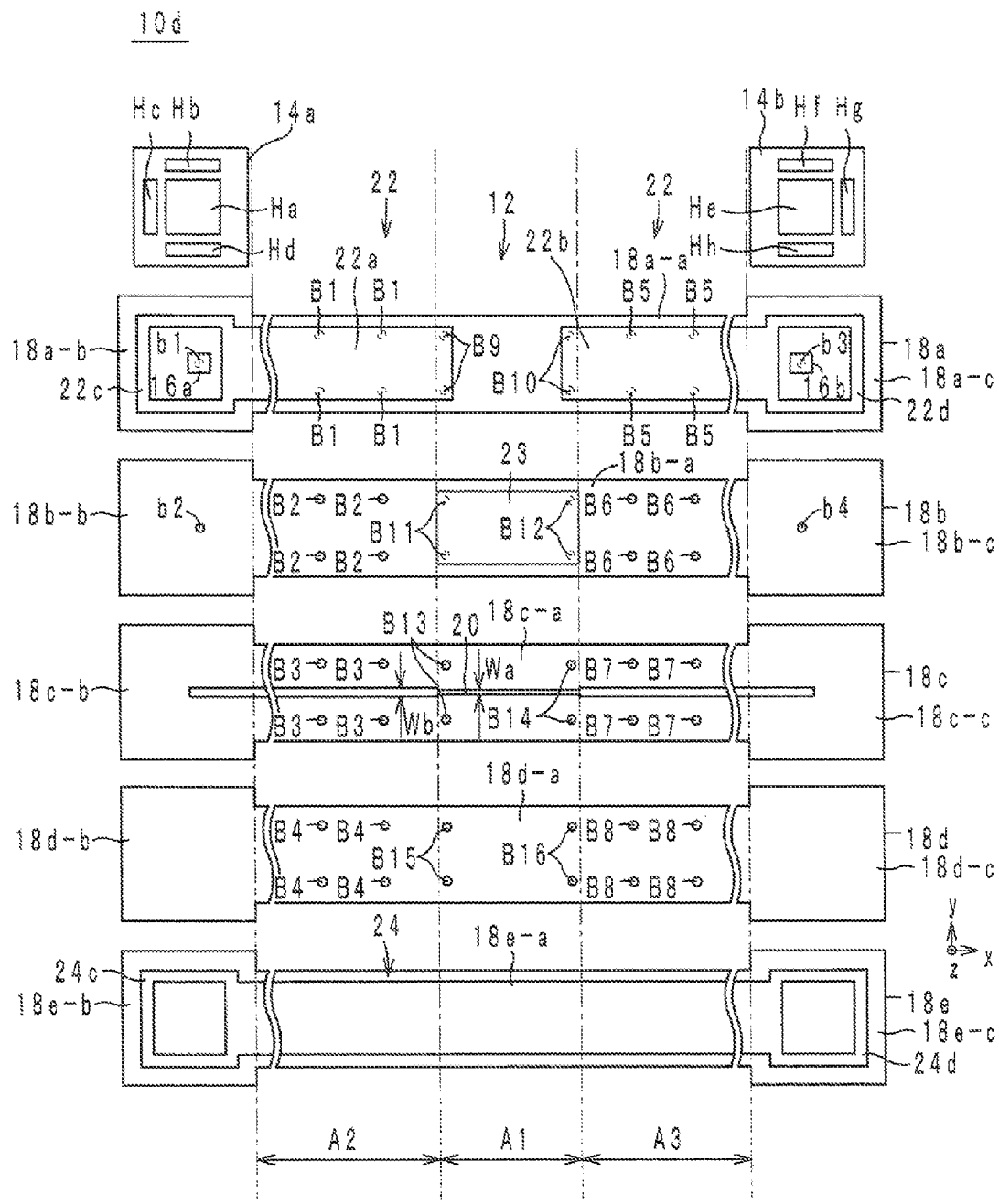

F I G . 11
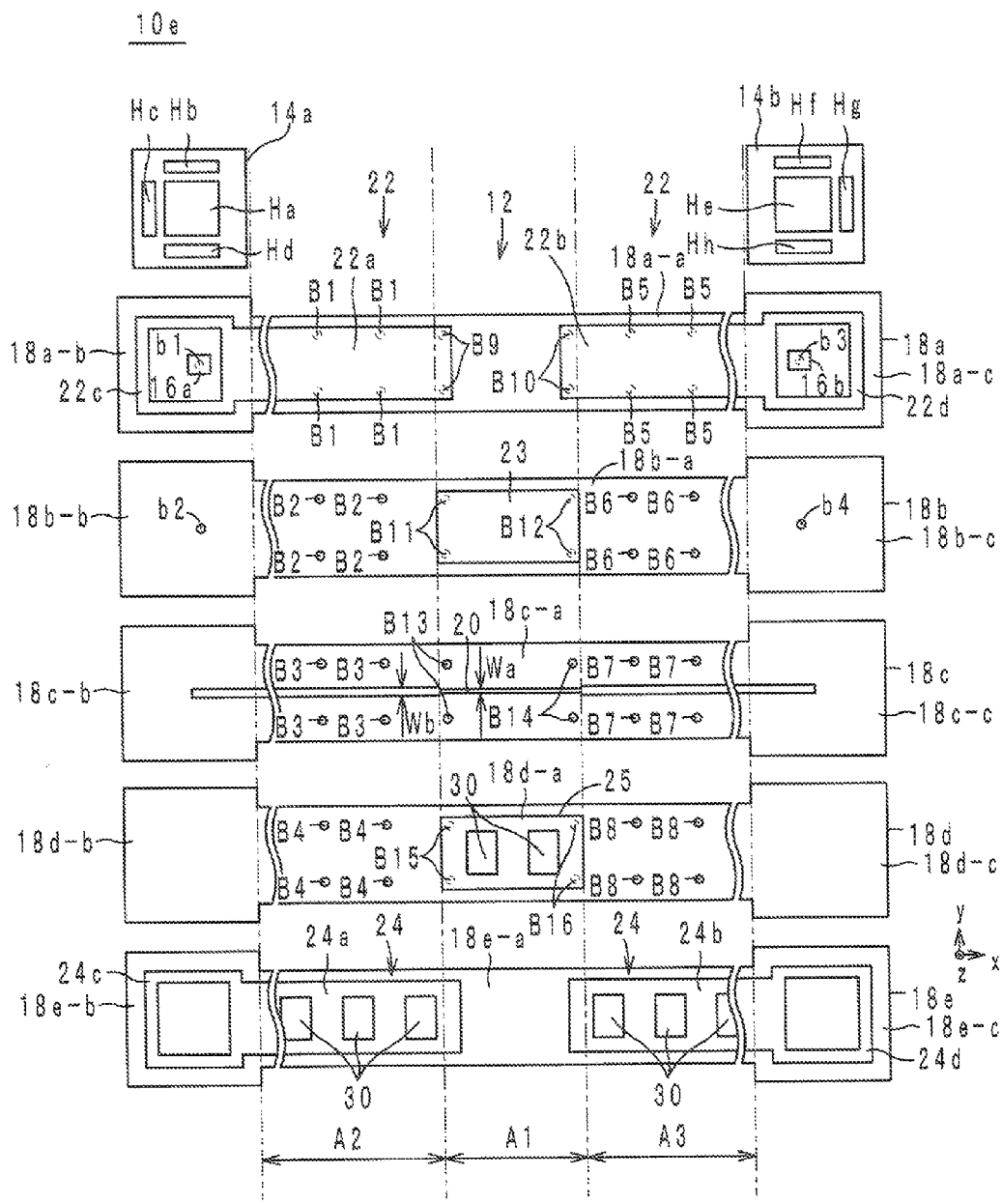

F I G . 1 8
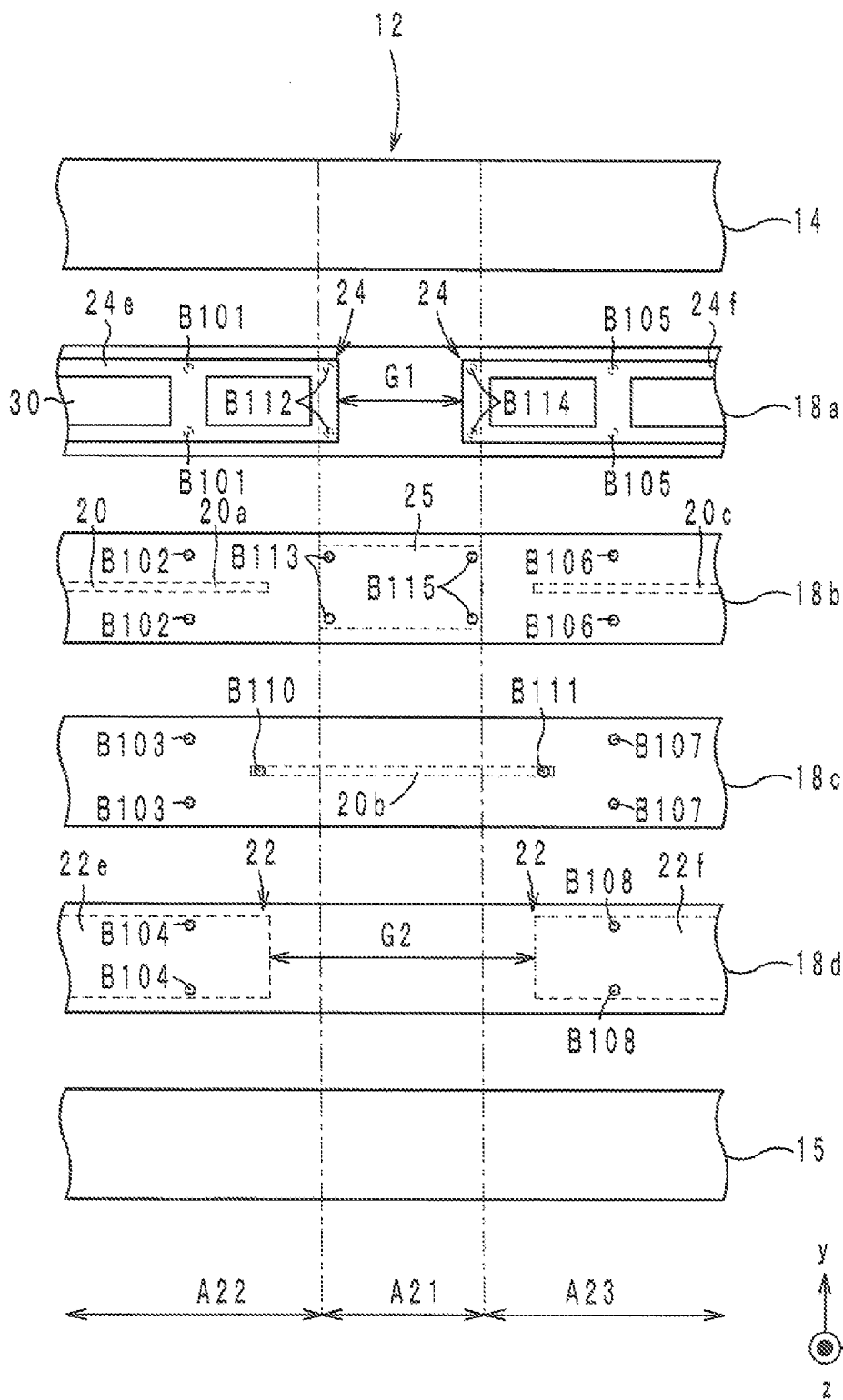

HIGH-FREQUENCY SIGNAL LINE AND ELECTRONIC DEVICE INCLUDING THE SAME

BACKGROUND OF THE PRESENT INVENTION

1. Field of the Present Invention

The present invention relates to high-frequency signal lines and electronic devices including the high-frequency signal lines, and more particularly relates to a high-frequency signal line including a signal conductive layer and a ground conductive layer, and an electronic device including the high-frequency signal line.

2. Description of the Related Art

A signal line described in, for example, Japanese Unexamined Patent Application Publication No. 2011-71403 is known as a high-frequency signal line of related art. FIGS. 20A to 20D provide an exploded view of a signal line 500 described in Japanese Unexamined Patent Application Publication No. 2011-71403.

The signal line 500 includes insulating sheets 522a to 522d, ground conductors 530 and 534, and a signal line portion 532. The insulating sheets 522a to 522d are stacked in that order from the upper side to the lower side. The ground conductors 530 and 534 are provided on the insulating sheets 522b and 522d, respectively. The signal line portion 532 is provided on the insulating sheet 522c. Hence, the signal line portion 532 is sandwiched between the insulating sheets 522b and 522d in the vertical direction. With the signal line 500 configured as described above, the thickness can be decreased as compared with a typical coaxial cable. Accordingly, the signal line 500 can be arranged in a small gap in a casing of a high-frequency device, such as a mobile communication terminal.

However, with the signal line 500 described in Japanese Unexamined Patent Application Publication No. 2011-71403, it may be difficult to bend the signal line 500 for use. To be more specific, in the signal line 500, since the ground conductors 530 and 534 and the signal line portion 532 are made of metal, such as copper, these parts are less likely deformed as compared with the insulating sheets 522a to 522d made of polyimide. Hence, if the ground conductors 530 and 534 and the signal line portion 532 overlap each other in the stacking direction like the signal line 500, it may be difficult to bend the signal line 500.

SUMMARY OF THE PRESENT INVENTION

Accordingly, preferred embodiments of the present invention provide a high-frequency signal line that can be easily bent, and an electronic device including the high-frequency signal line.

With preferred embodiments of the present invention, the high-frequency signal line can be easily bent.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a high-frequency signal line according to a first preferred embodiment of the present invention.

FIG. 2 is an exploded view of a dielectric element body of the high-frequency signal line in FIG. 1.

FIGS. 4A and 4B are an external perspective view and a cross-sectional structure diagram, respectively, of a connector of the high-frequency signal line.

FIG. 10 is an exploded view of a high-frequency signal line according to a fourth modification of a preferred embodiment of the present invention.

FIG. 11 is an exploded view of a high-frequency signal line according to a fifth modification of a preferred embodiment of the present invention.

FIG. 18 is an exploded view of a portion of the high-frequency signal line in FIG. 17, the portion being bent in a valley form.

DETAILED DESCRIPTION OF THE PREFERRED EMBODIMENTS

High-frequency signal lines according to preferred embodiments of the present invention, and electronic devices including the respective high-frequency signal lines are described below with reference to the drawings.

First Preferred Embodiment

Figure 3:
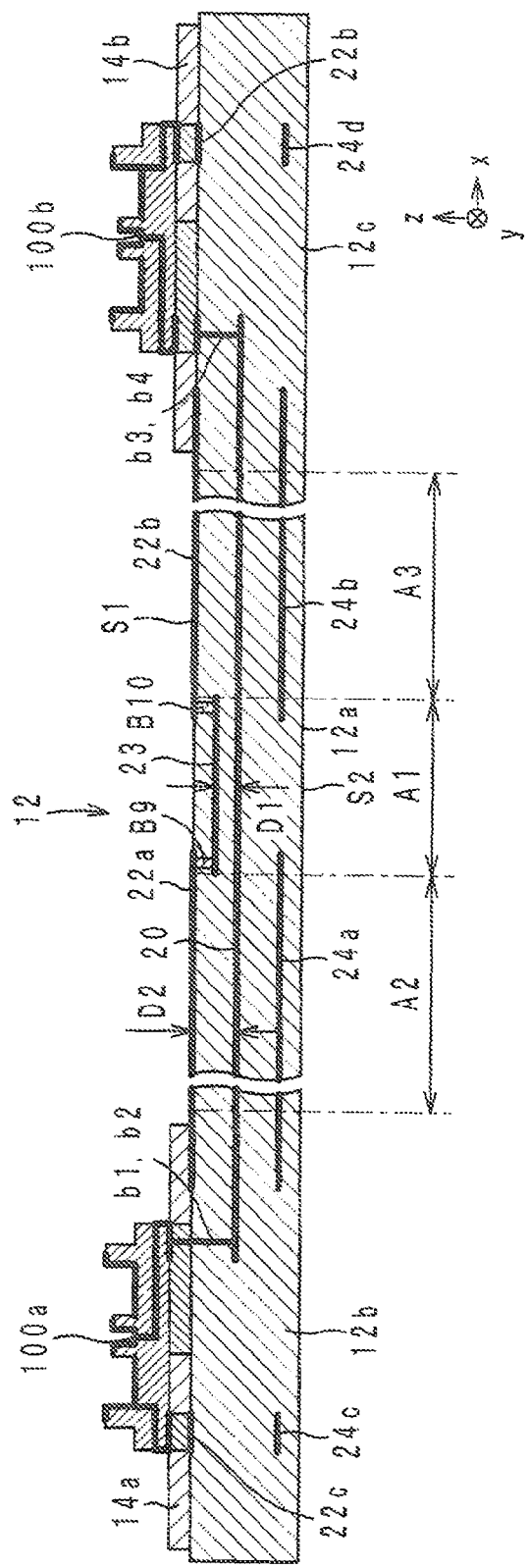
FIG. 3 is a cross-sectional structure diagram of the high-frequency signal line in FIG. 1.

A configuration of a high-frequency signal line according to a first preferred embodiment of the present invention is described below with reference to the drawings. FIG. 1 is an external perspective view of a high-frequency signal line 10 according to the first preferred embodiment of the present invention. The high-frequency signal line 10 is preferably used as a flat cable, for example. FIG. 2 is an exploded view of a dielectric element body 12 of the high-frequency signal line 10 in FIG. 1. FIG. 3 is a cross-sectional structure diagram of the high-frequency signal line 10 in FIG. 1. FIGS. 4A and 4B are an external perspective view and a cross-sectional structure diagram, respectively, of a connector 100b of the high-frequency signal line 10. In FIGS. 1 to 4B, a stacking direction of the high-frequency signal line 10 is defined as the z-axis direction. Also, the longitudinal direction of the high-frequency signal line 10 is defined as the x-axis direction. A direction orthogonal to the x-axis direction and the z-axis direction is defined as the y-axis direction.

The high-frequency signal line 10 is preferably used to connect two high-frequency circuits with each other in an electronic device, such as a cellular phone, for example. As shown in FIGS. 1 to 3, the high-frequency signal line 10 includes the dielectric element body 12, protection layers 14a, 14b, external terminals 16a, 16b, a signal conductive layer 20, ground conductive layers 22, 23, and 24, via-hole conductors b1 to b4, and B1 to B8, and connectors 100a and 100b.

The dielectric element body 12 extends in the x-axis direction in plan view in the z-axis direction, and includes a line unit 12a, and connection units 12b and 12c. The dielectric element body 12 is a multilayer body preferably formed by stacking dielectric sheets (insulating layers) 18a to 18e in that order from the positive side to the negative side in the z-axis direction. In the following description, the principal surface at the positive side in the z-axis direction of the dielectric element body 12 is called a front surface S1, and the principal surface at the negative side in the z-axis direction of the dielectric element body 12 is called a back surface S2.

The line unit 12a extends in the x-axis direction. As shown in FIGS. 2 and 3, the line unit 12a includes regions A1 to A3. The regions A2, A1, and A3 are arranged in that order in the x-axis direction, and are adjacent to each other. The connection units 12b and 12c are connected with an end portion at the negative side in the x-axis direction and an end portion at the positive side in the x-axis direction of the line unit 12a, respectively, and have rectangular or substantially rectangular shapes. The widths in the y-axis direction of the connection units 12b and 12c are larger than the width in the y-axis direction of the line unit 12a. Alternatively, the connection units 12b and 12c may not have the rectangular or substantially rectangular shapes. Also, the widths in the y-axis direction of the connection units 12b and 12c may not be larger than the width in the y-axis direction of the line unit 12a. For example, the widths in the y-axis direction of the connection units 12b and 12c may be equal to the width in the y-axis direction of the line unit 12a.

The dielectric sheets 18 extend in the x-axis direction and have the same shape as the shape of the dielectric element body 12 in plan view in the z-axis direction. The dielectric sheets 18 are made of flexible thermoplastic resin, such as polyimide or a liquid crystal polymer. The thickness of the stacked dielectric sheets 18a to 18e is preferably in a range from about 50 μm to about 400 μm, for example. In the following description, the principal surface at the positive side in the z-axis direction of each of the dielectric sheets 18 (18a to 18e) is called a front surface, and the principal surface at the negative side in the z-axis direction of each of the dielectric sheets 18 is called a back surface.

Also, the dielectric sheet 18a includes a line portion 18a-a, and connection portions 18a-b and 18a-c. The dielectric sheet 18b includes a line portion 18b-a, and connection portions 18b-b and 18b-c. The dielectric sheet 18c includes a line portion 18c-a, and connection portions 18c-b and 18c-c. The dielectric sheet 18d includes a line portion 18d-a, and connection portions 18d-b and 18d-c. The dielectric sheet 18e includes a line portion 18e-a, and connection portions 18e-b and 18e-c. The line portions 18a-a, 18b-a, 18c-a, 18d-a, and 18e-a define the line unit 12a. The connection portions 18a-b, 18b-b, 18c-b, 18d-b, and 18e-b define the connection unit 12b. The connection portions 18a-c, 18b-c, 18c-c, 18d-c, and 18e-c define the connection unit 12c.

As shown in FIGS. 1 and 2, the external terminal 16a is a rectangular or substantially rectangular conductor provided near the center of the front surface of the connection portion 18a-b. As shown in FIGS. 1 and 2, the external terminal 16b is a rectangular or substantially rectangular conductor provided near the center of the front surface of the connection portion 18a-c. The external terminals 16a and 16b are made of a metal material mainly containing silver or copper and having a small specific resistance. Also, the front surfaces of the external terminals 16a and 16b are preferably processed by gold plating.

As shown in FIG. 2, the signal conductive layer 20 is a line-shaped conductive layer provided in the dielectric element body 12. The signal conductive layer 20 extends in the x-axis direction on the front surface of the dielectric sheet 18c. Both ends of the signal conductive layer 20 overlap the respective external terminals 16a and 16b in plan view in the z-axis direction. The signal conductive layer 20 has a line width, for example, in a range from about 100 μm to about 500 μm, for example. In this preferred embodiment, the signal conductive layer 20 has a line width of about 240 μm, for example. The signal conductive layer 20 is made of a metal material mainly containing silver or copper and having a small specific resistance.

The via-hole conductor b1 penetrates through the connection portion 18a-b of the dielectric sheet 18a in the z-axis direction. The via-hole conductor b2 penetrates through the connection portion 18b-b of the dielectric sheet 18b in the z-axis direction. The via-hole conductors b1 and b2 are connected with each other and define a single via-hole conductor. The formed via-hole conductor connects the external terminal 16a with an end portion at the negative side in the x-axis direction of the signal conductive layer 20. The via-hole conductors b1 and b2 are made of a metal material mainly containing silver or copper and having a small specific resistance.

The via-hole conductor b3 penetrates through the connection portion 18a-c of the dielectric sheet 18a in the z-axis direction. The via-hole conductor b4 penetrates through the connection portion 18b-c of the dielectric sheet 18b in the z-axis direction. The via-hole conductors b3 and b4 are connected with each other and define a single via-hole conductor. The via-hole conductor connects the external terminal 16b with an end portion at the positive side in the x-axis direction of the signal conductive layer 20.

As shown in FIG. 2, the ground conductive layer 22 is provided on the dielectric element body 12 and faces the signal conductive layer 20. To be more specific, in the dielectric element body 12, the ground conductive layer 22 extends in the x-axis direction on the front surface of the dielectric sheet 18a being the closest to the front surface S1 of the dielectric element body 12. Hence, the ground conductive layer 22 is located at the positive side in the z-axis direction with respect to the signal conductive layer 20, and faces the signal conductive layer 20 through the dielectric sheets 18a and 18b. The ground conductive layer 22 is made of a metal material mainly containing silver or copper and having a small specific resistance. Further, the front surface of the ground conductive layer 22 is preferably processed with gold plating or the like for rust prevention.

Also, the ground conductive layer 22 includes line portions 22a and 22b, and terminal portions 22c and 22d. The line portion 22a is provided in the region A2 on the front surface of the line portion 18a-a, and extends in the x-axis direction. However, the line portion 22a slightly protrudes to the region A1 on the front surface of the line portion 18a-a. The line portion 22b is provided in the region A3 on the front surface of the line portion 18a-a, and extends in the x-axis direction. The line portions 22a and 22b face each other through the region A1, and are not connected with each other. However, the line portion 22b slightly protrudes to the region A1 on the front surface of the line portion 18a-a.

The terminal portion 22c is provided on the front surface of the connection portion 18a-b, and has a rectangular or substantially rectangular ring shape surrounding the periphery of the external terminal 16a. The terminal portion 22c is connected with an end portion at the negative side in the x-axis direction of the line portion 22a. The terminal portion 22d is provided on the front surface of the connection portion 18a-c, and has a rectangular or substantially rectangular ring shape surrounding the periphery of the external terminal 16b. The terminal portion 22d is connected with an end portion at the positive side in the x-axis direction of the line portion 22b.

As shown in FIG. 2, the ground conductive layer 23 is provided in the dielectric element body 12 and faces the signal conductive layer 20. To be more specific, the ground conductive layer 23 extends in the x-axis direction in the region A1 on the front surface of the dielectric sheet 18b in the dielectric element body 12. Hence, the ground conductive layer 23 is located at the positive side in the z-axis direction with respect to the signal conductive layer 20 and at the negative side in the z-axis direction with respect to the ground conductive layer 22 in the dielectric element body 12, and faces the signal conductive layer 20 through the dielectric sheet 18b. Hence, as shown in FIG. 3, a distance D1 between the ground conductive layer 23 and the signal conductive layer 20 is smaller than a distance D2 between the ground conductive layer and the signal conductive layer 20. Also, since the line portions 22a and 22b slightly protrude to the region A1, both ends in the x-axis direction of the ground conductive layer 23 overlap respective end portions of the line portions 22a and 22b. The ground conductive layer 23 is made of a metal material mainly containing silver or copper and having a small specific resistance.

In this preferred embodiment, four via-hole conductors B9 are provided in line in the y-axis direction, and penetrate through the dielectric sheet 18a in the z-axis direction. The via-hole conductors B9 connect the end portion at the positive side in the x-axis direction of the line portion 22a with the end portion at the negative side in the x-axis direction of the ground conductive layer 23. In this preferred embodiment, four via-hole conductors B10 are provided in line in the y-axis direction, and penetrate through the dielectric sheet 18a in the z-axis direction. The via-hole conductors B10 connect the end portion at the negative side in the x-axis direction of the line portion 22b with an end portion at the positive side in the x-axis direction of the ground conductive layer 23. Hence, the ground conductive layers 22 and 23 define a first ground conductive layer provided in the dielectric element body 12, and facing the signal conductive layer 20.

As shown in FIG. 2, the ground conductive layer 24 is provided in the dielectric element body 12 and faces the ground conductive layer 22 through the signal conductive layer 20. To be more specific, in the dielectric element body 12, the ground conductive layer 24 extends in the x-axis direction on the front surface of the dielectric sheet 18e being the closest to the back surface S2 of the dielectric element body 12. Hence, the ground conductive layer 24 is located at the negative side in the z-axis direction with respect to the signal conductive layer in the dielectric element body 12, and faces the signal conductive layer 20 through the dielectric sheet 18d. The ground conductive layer 24 is made of a metal material mainly containing silver or copper and having a small specific resistance.

Also, the ground conductive layer 24 includes line portions 24a and 24b, and terminal portions 24c and 24d. The line portion 24a is provided in the region A2 on the front surface of the line portion 18e-a, and extends in the x-axis direction. However, the line portion 24a slightly protrudes to the region A1 on the front surface of the line portion 18e-a. The line portion 24b is provided in the region A3 on the front surface of the line portion 18e-a, and extends in the x-axis direction. The line portions 24a and 24b face each other through the region A1, and are not connected with each other. However, the line portion 24b slightly protrudes to the region A1 on the front surface of the line portion 18e-a. As described above, the ground conductive layer 24 is not provided in at least a portion of the region A1.

The terminal portion 24c is provided on the front surface of the connection portion 18e-b, and has a rectangular or substantially rectangular ring shape, similarly to the terminal portion 22c. The terminal portion 24c is connected with an end portion at the negative side in the x-axis direction of the line portion 24a. The terminal portion 24d is provided on the front surface of the connection portion 18e-c, and has a rectangular or substantially rectangular ring shape, similarly to the terminal portion 22d. The terminal portion 24d is connected with an end portion at the positive side in the x-axis direction of the line portion 24b.

As described above, the signal conductive layer 20 is sandwiched between the ground conductive layers 22 and 23, and the ground conductive layer 24 from both sides in the z-axis direction. That is, the signal conductive layer 20 and the ground conductive layers 22, 23, and 24 define a triplate stripline structure except for a portion in the region A1.

In this preferred embodiment, the high-frequency signal line 10 includes the ground conductive layer 24. However, the ground conductive layer 24 may not be provided. That is, the ground conductive layers 22 and 23, and the signal conductive layer 20 may define a high-frequency signal line having a microstripline structure. However, to prevent radiation from being generated, a triplate stripline structure such as the high-frequency signal line 10 may be preferably provided.

A plurality of the via-hole conductors B1 penetrate through the line portion 18a-a of the dielectric sheet 18a in the z-axis direction. A plurality of the via-hole conductors B2 penetrate through the line portion 18b-a of the dielectric sheet 18b in the z-axis direction. A plurality of the via-hole conductors B3 penetrate through the line portion 18c-a of the dielectric sheet 18c in the z-axis direction. A plurality of the via-hole conductors B4 penetrate through the line portion 18d-a of the dielectric sheet 18d in the z-axis direction. The via-hole conductors B1 to B4 are connected with each other and define a single via-hole conductor. The single via-hole conductor connects the line portion 22a with the line portion 24a. The via-hole conductors B1 to B4 are made of a metal material mainly containing silver or copper and having a small specific resistance.

A plurality of the via-hole conductors B5 penetrate through the line portion 18a-a of the dielectric sheet 18a in the z-axis direction. A plurality of the via-hole conductors B6 penetrate through the line portion 18b-a of the dielectric sheet 18b in the z-axis direction. A plurality of the via-hole conductors B7 penetrate through the line portion 18c-a of the dielectric sheet 18c in the z-axis direction. A plurality of the via-hole conductors B8 penetrate through the line portion 18d-a of the dielectric sheet 18d in the z-axis direction. The via-hole conductors B5 to B8 are connected with each other and define a single via-hole conductor. The single via-hole conductor connects the line portion 22b with the line portion 24b. The via-hole conductors B5 to B8 are made of a metal material mainly containing silver or copper and having a small specific resistance.

The protection layer 14a covers the front surface of the connection portion 18a-b. However, the protection layer 14a has openings Ha to Hd. The opening Ha is a rectangular or substantially rectangular opening provided at the center of the protection layer 14a. The external terminal 16a is exposed to the outside through the opening Ha. Also, the opening Hb is a rectangular opening provided at the positive side in the y-axis direction of the opening Ha. The opening Hc is a rectangular or substantially rectangular opening provided at the negative side in the x-axis direction of the opening Ha. The opening Hd is a rectangular or substantially rectangular opening provided at the negative side in the y-axis direction of the opening Ha. The terminal portion 22c is exposed to the outside through the openings Hb to Hd, and hence functions as an external terminal. The protection layer 14a is made of, for example, flexible resin, such as a resist material.

The protection layer 14b covers the front surface of the connection portion 18a-c. However, the protection layer 14b has openings He to Hh. The opening He is a rectangular or substantially rectangular opening provided at the center of the protection layer 14b. The external terminal 16b is exposed to the outside through the opening He. Also, the opening Hf is a rectangular or substantially rectangular opening provided at the positive side in the y-axis direction of the opening He. The opening Hg is a rectangular or substantially rectangular opening provided at the positive side in the x-axis direction of the opening He. The opening Hh is a rectangular or substantially rectangular opening provided at the negative side in the y-axis direction of the opening He. The terminal portion 22d is exposed to the outside through the openings Hf to Hh, and hence functions as an external terminal. The protection layer 14b is made of, for example, flexible resin, such as a resist material.

The connectors 100a and 100b are mounted on the surfaces of the connection units 12b and 12c, respectively. The connectors 100a and 100b have the same configuration. Hence, an example with the configuration of the connector 100b is described below.

As shown in FIGS. 1, 4A, and 4B, the connector 100b includes a connector body 102, external terminals 104 and 106, a central conductor 108, and an external conductor 110. The connector body 102 has a shape in which a cylindrical member is coupled with a rectangular or substantially rectangular plate member, and is made of an insulating material such as resin.

The external terminal 104 is provided at a position to face the external terminal 16b, on the surface at the negative side in the z-axis direction of the plate member of the connector body 102. The external terminal 106 is provided at a position to face the terminal portion 22d exposed through the openings Hf to Hh, on the surface at the negative side in the z-axis direction of the plate member of the connector body 102.

The central conductor 108 is provided at the center of the cylindrical member of the connector body 102, and is connected with the external terminal 104. The central conductor 108 is a signal terminal, to which a high-frequency signal is input, or from which a high-frequency signal is output. The external conductor 110 is provided on the inner peripheral surface of the cylinder of the connector body 102, and is connected with the external terminal 106. The external conductor 110 is a ground terminal that is held at ground potential.

The connector 100b configured as described above is mounted on the front surface of the connection unit 12c so that the external terminal 104 is connected with the external terminal 16b and the external terminal 106 is connected with the terminal portion 22d. Accordingly, the signal conductive layer is electrically connected with the central conductor 108. Also, the ground conductive layers 22 and 24 are electrically connected with the external conductor 110.

Figure 5:
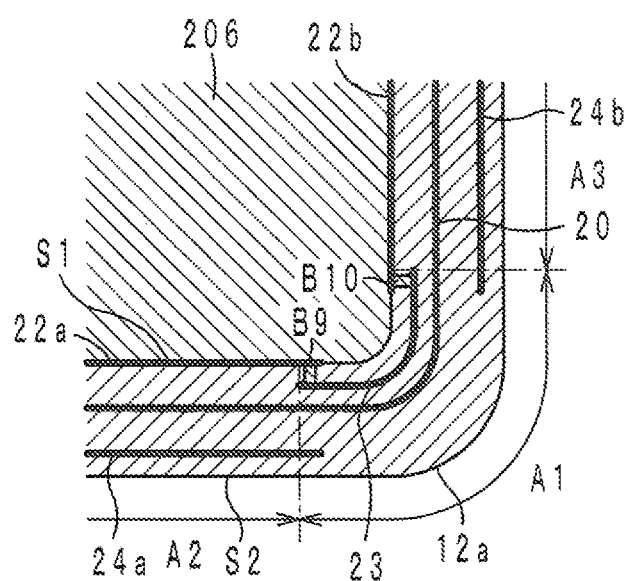
FIG. 5 is an illustration showing an example when the high-frequency signal line is attached to an electronic device.

The high-frequency signal line 10 is bent when being used. FIG. 5 is an illustration showing an example when the high-frequency signal line 10 is attached to an electronic device.

The electronic device includes the high-frequency signal line 10, a battery pack 206, and a casing. The casing houses the high-frequency signal line 10 and the battery pack 206. As shown in FIG. 5, the dielectric element body 12 is bent in the region A1 so that the ground conductive layers 22 and 23 are located at the inner periphery side with respect to the signal conductive layer 20. That is, the front surface S1 of the dielectric element body 12 is located at the inner periphery side with respect to the back surface S2 of the dielectric element body 12. The battery pack 206 of the electronic device contacts the front surface S1. The battery pack 206 is, for example, a lithium ion secondary battery, and has a structure in which the surface of the battery pack 206 is covered with a metal cover. The metal cover is held at ground potential. Hence, if the metal cover contacts the ground conductive layer 22, the ground conductive layer 22 is also held at ground potential.

As described above, the high-frequency signal line 10 is bent so that a bent portion of the electronic device is aligned with the region A1, while the ground conductive layers 22 and 23 are brought into contact with the electronic device held at ground potential so that the ground conductive layers 22 and 23 are located at the inner periphery side. Accordingly, the ground conductive layers 22 and 23 are reliably grounded. The electronic device is not limited to the battery pack, and may be a metal case, a circuit board, etc.

An example of a manufacturing method of the high-frequency signal line 10 is described below with reference to FIG. 2. An example in which a single high-frequency signal line 10 is manufactured is described below. However, actually, a plurality of high-frequency signal lines 10 are simultaneously manufactured by staking large-size dielectric sheets and cutting the sheets.

First, the dielectric sheets 18, each of which is made of thermoplastic resin and including a copper foil provided entirely on the front surface, are prepared. The front surface of the copper foil of each dielectric sheet 18 is smoothened, for example, by galvanizing for rust prevention. The dielectric sheet 18 preferably is a liquid crystal polymer having a thickness in a range from about 20 μm to about 80 μm, for example. The copper foil preferably has a thickness in a range from about 10 μm to about 20 μm, for example.

Then, the external terminals 16 and the ground conductive layer 22 shown in FIG. 2 are formed on the front surface of the dielectric sheet 18a by a photolithography process. To be specific, a resist having a shape corresponding to the shapes of the external terminals 16a, 16b and the ground conductive layer 22 shown in FIG. 2 is printed on the copper foil of the dielectric sheet 18a. Then, the copper foil is etched, and hence a portion of the copper foil not covered with the resist is removed. Then, the resist is removed. Accordingly, the external terminals 16a and 16b and the ground conductive layer 22 as shown in FIG. 2 are formed on the front surface of the dielectric layer 18a.

Then, the ground conductive layer 23 shown in FIG. 2 is formed on the front surface of the dielectric sheet 18b by a photolithography process. Also, the signal conductive layer 20 shown in FIG. 2 is formed on the front surface of the dielectric sheet 18c by a photolithography process. Also, the ground conductive layer 24 shown in FIG. 2 is formed on the front surface of the dielectric sheet 18e by a photolithography process. These photolithography processes are similar to the photolithography process when the external terminals 16 and the ground conductive layer 22 are formed, and hence the description is omitted.

Then, a laser beam is emitted on the dielectric sheets 18a to 18d from the back surface side, and through holes are formed, at the positions at which the via-hole conductors b1 to b4, and B1 to B10 are formed. Then, the through holes formed in the dielectric sheets 18a to 18d are filled with conductive paste.

Then, the dielectric sheets 18a to 18e are stacked in that order from the positive side to the negative side in the z-axis direction so that the ground conductive layers 22 and 23, the signal conductive layer 20, and the ground conductive layer 24 define a stripline structure. Then, heat and pressure are applied to the dielectric sheets 18a to 18e from the positive side and the negative side in the z-axis direction. The dielectric sheets 18a to 18e are softened, press-bonded, and integrated; the conductive paste filled in the through holes is hardened; and hence the via-hole conductors b1 to b4, and B1 to B10 shown in FIG. 2 are formed. Alternatively, the dielectric sheets 18 may be integrated by using an adhesive made of, for example, epoxy resin, instead of thermal compression bonding. Still alternatively, the via-hole conductors b1 to b4, and B1 to B10 may be formed by integrating the dielectric sheets 18, then forming the through holes, and filling the through holes with the conductive paste, or forming a film by plating. Further alternatively, the via-hole conductors do not have to be formed by completely filling the through holes with a conductor. The via-hole conductors may be formed of a thin-film conductor formed along wall surfaces of the through holes. That is, it is only required that a conductor is applied to the through holes so that the interlayer of the dielectric sheets 18 can be connected.

Finally, the protection layers 14a and 14b are formed on the dielectric sheet 18a by applying resin (resist) paste. Accordingly, the high-frequency signal line 10 shown in FIG. 1 is obtained.

With the high-frequency signal line 10 configured as described above, the high-frequency signal line 10 can be easily bent. To be more specific, in the signal line 500 described in Japanese Unexamined Patent Application Publication No. 2011-71403, the ground conductors 530 and 534 and the signal line portion 532 are made of metal, such as copper, and hence these portions are less likely deformed as compared with the insulating sheets 522a to 522d made of polyimide. Hence, if the ground conductors 530 and 534 and the signal line portion 532 overlap each other in the stacking direction like the signal line 500, it may be difficult to bend the signal line 500.

To address this, with the high-frequency signal line 10, the distance D1 between the ground conductive layer 23 and the signal conductive layer 20 in the region A1 is smaller than the distance D2 between the ground conductive layer 22 and the signal conductive layer 20 in the regions A2 and A3. Further, the dielectric element body 12 is bent in the region A1 so that the ground conductive layers 22 and 23 are located at the inner periphery side with respect to the signal conductive layer 20. Accordingly, the high-frequency signal line 10 can be easily bent as described below.

When the high-frequency signal line 10 is bent, the ground conductive layer located at the inner periphery side is compressed. Then, as the ground conductive layer becomes far from the signal conductive layer 20 to the positive side in the z-axis direction, the radius of the bent portion of the ground conductive layer becomes small. Hence, the compression amount of the ground conductive layer is increased, and the force required for bending the high-frequency signal line 10 is also increased.

To address this, in the high-frequency signal line 10, the distance D1 between the ground conductive layer 23 and the signal conductive layer 20 in the region A1, in which the dielectric element body 12 is bent, is smaller than the distance D2 between the ground conductive layer 22 and the signal conductive layer 20 in the regions A2 and A3, in which the dielectric element body 12 is not bent. That is, the ground conductive layer 23 in the region A1 is located at the outer periphery side with respect to the ground conductive layer 22 in the regions A2 and A3. Accordingly, the compression amount of the ground conductive layer 23 is decreased, and the force required to bend the high-frequency signal line 10 is decreased. Further, in the high-frequency signal line 10, the ground conductive layers 22 and 23 are prevented from being bent and broken.

Also, in the high-frequency signal line 10, the ground conductive layer 24, which disturbs deformation of the dielectric element body 12 in the region A1, is not provided in at least a portion of the region A1, in which the dielectric element body 12 is bent. As the result, the high-frequency signal line 10 can be easily bent.

Further, when the high-frequency signal line 10 is bent, the ground conductive layer located at the outer periphery side is expanded. Then, as the ground conductive layer becomes far from the signal conductive layer 20 to the negative side in the z-axis direction, the radius of the bent portion of the ground conductive layer becomes large. Hence, the expansion amount of the ground conductive layer is increased, and the likelihood of occurrence of a break in the ground conductive layer is increased.

To address this, in the high-frequency signal line 10, the ground conductive layer 24 is not provided in at least a portion of the region A1, in which the dielectric element body 12 is bent. Accordingly, when the high-frequency signal line 10 is bent, the ground conductive layer 24 is prevented from being broken.

Also, with the high-frequency signal line 10, the ground conductive layer 23 located in the region A1, in which the dielectric element body 12 is bent, is provided in the dielectric element body 12. Hence, gold plating for rust prevention is not applied to the front surface of the ground conductive layer 23, unlike the front surface of the ground conductive layer 22. In general, if plating, such as gold plating, is applied to a conductive layer, the conductive layer may become hard, and may become easily cracked. Accordingly, the ground conductive layer 23 can be more easily deformed as compared with the ground conductive layer 22. As the result, the high-frequency signal line 10 can be easily bent.

Also, as shown in FIG. 5, the ground conductive layers 22 and 23 are present between the signal conductive layer 20 and the battery pack 206. Accordingly, electromagnetic coupling is prevented from being generated between the signal conductive layer 20 and the battery pack 206. As the result, in the high-frequency signal line 10, the characteristic impedance of the signal conductive layer 20 is prevented from being deviated from a predetermined characteristic impedance.

Also, with the high-frequency signal line 10, the characteristic impedance in the region A1, in which the dielectric element body 12 is bent, is prevented from being deviated from a predetermined characteristic impedance (for example, 50Ω). To be more specific, the distance D1 between the ground conductive layer 23 and the signal conductive layer 20 in the region A1 is smaller than the distance D2 between the ground conductive layer 22 and the signal conductive layer 20 in the region A2. Hence, the capacitance generated between the ground conductive layer 23 and the signal conductive layer 20 in the region A1 is larger than the capacitance generated between the ground conductive layer 22 and the signal conductive layer 20 in the region A2. Accordingly, the characteristic impedance in the region A1 is relatively smaller than the characteristic impedances in the regions A2 and A3, and may be deviated from the predetermined characteristic impedance of the high-frequency signal line 10.

To prevent this, in the high-frequency signal line 10, the ground conductive layer 24 is not provided in at least a portion of the region A1. Accordingly, the capacitance is not generated between the ground conductive layer 24 and the signal conductive layer 20 in the region A1. The characteristic impedance in the region A1 becomes larger than the characteristic impedance in the region, in which the ground conductive layer 24 is present. As the result, by adjusting the distance D2 between the ground conductive layer 23 and the signal conductive layer 20, the characteristic impedance in the region A1 is prevented from being deviated from the predetermined characteristic impedance in the high-frequency signal line 10.

First Modification of First Preferred Embodiment

Figure 6:
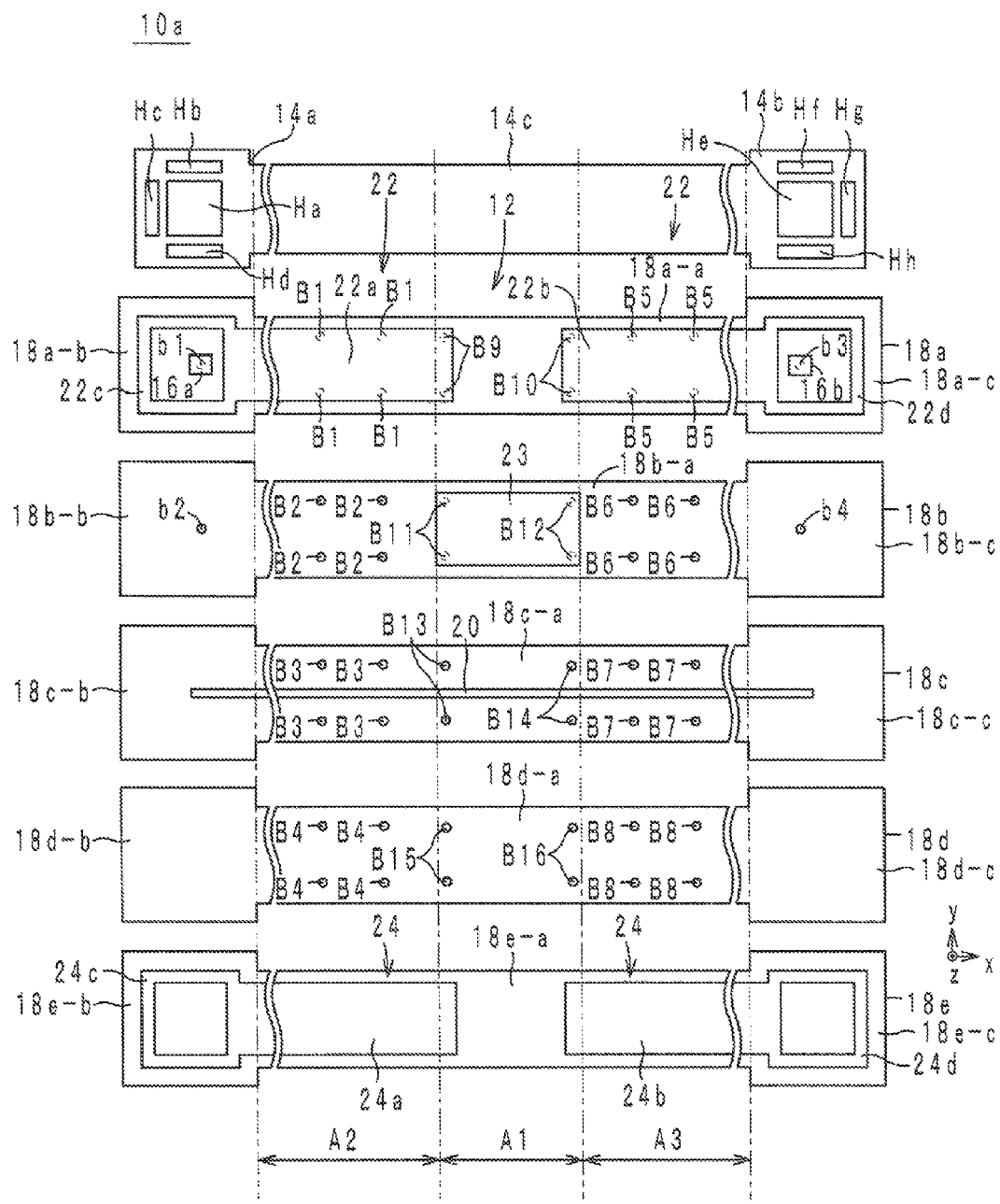
FIG. 6 is an exploded view of a high-frequency signal line according to a first modification of a preferred embodiment of the present invention.

A high-frequency signal line according to a first modification of the first preferred embodiment is described below with reference to the drawing. FIG. 6 is an exploded view of a high-frequency signal line 10a according to the first modification.

The high-frequency signal line 10 differs from the high-frequency signal line 10a in that the ground conductive layer 23 is connected with the ground conductive layer 24. The high-frequency signal line 10a is described below mainly for the different point.

The high-frequency signal line 10a includes via-hole conductors B11 to B16. The via-hole conductors B11, B13, and B15 penetrate through the line portions 18b-a, 18c-a, and 18d-a, respectively, in the z-axis direction, and define a single via-hole conductor together with the via-hole conductors B9. The via-hole conductors B11, B13, and B15 connect the ground conductive layer 23 with the line portion 24a.

The via-hole conductors B12, B14, and B16 penetrate through the line portions 18b-a, 18c-a, and 18d-a, respectively, in the z-axis direction, and define a single via-hole conductor together with the via-hole conductors B10. The via-hole conductors B12, B14, and B16 connect the ground conductive layer 23 with the line portion 24b.

In the high-frequency signal line 10, preferably four of the via-hole conductors B9 and B10 are provided, for example. However, in the high-frequency signal line 10a, preferably only two of the via-hole conductors B9 to B15 are provided, for example, so that the via-hole conductors B13 or B14 do not contact the signal conductive layer 20.

With the high-frequency signal line 10a, the ground conductive layer 23 is connected with the ground conductive layers 22 and 24, the ground conductive layer 23 is more reliably held at ground potential.

Also, the via-hole conductors B9 to B16 are harder and less likely deformed as compared with the dielectric element body 12. Hence, when the dielectric element body 12 is bent in the region A1, in which the via-hole conductors B9 to B16 are provided, the distance between the ground conductive layer 23 and the signal conductive layer 20 in the region A1 less likely varies. As the result, in the high-frequency signal line 10a, the characteristic impedance in the region A1 is prevented from varying.

In the high-frequency signal line 10a according to the first modification, a protection layer 14c is provided in addition to the protection layers 14a and 14b, to connect the protection layers 14a and 14b, and to cover the line portions 22a and 22b. As described above, the high-frequency signal line according to a preferred embodiment of the present invention may include the protection layer 14c in addition to the protection layers 14a and 14b.

Second Modification of First Preferred Embodiment

Figure 7:
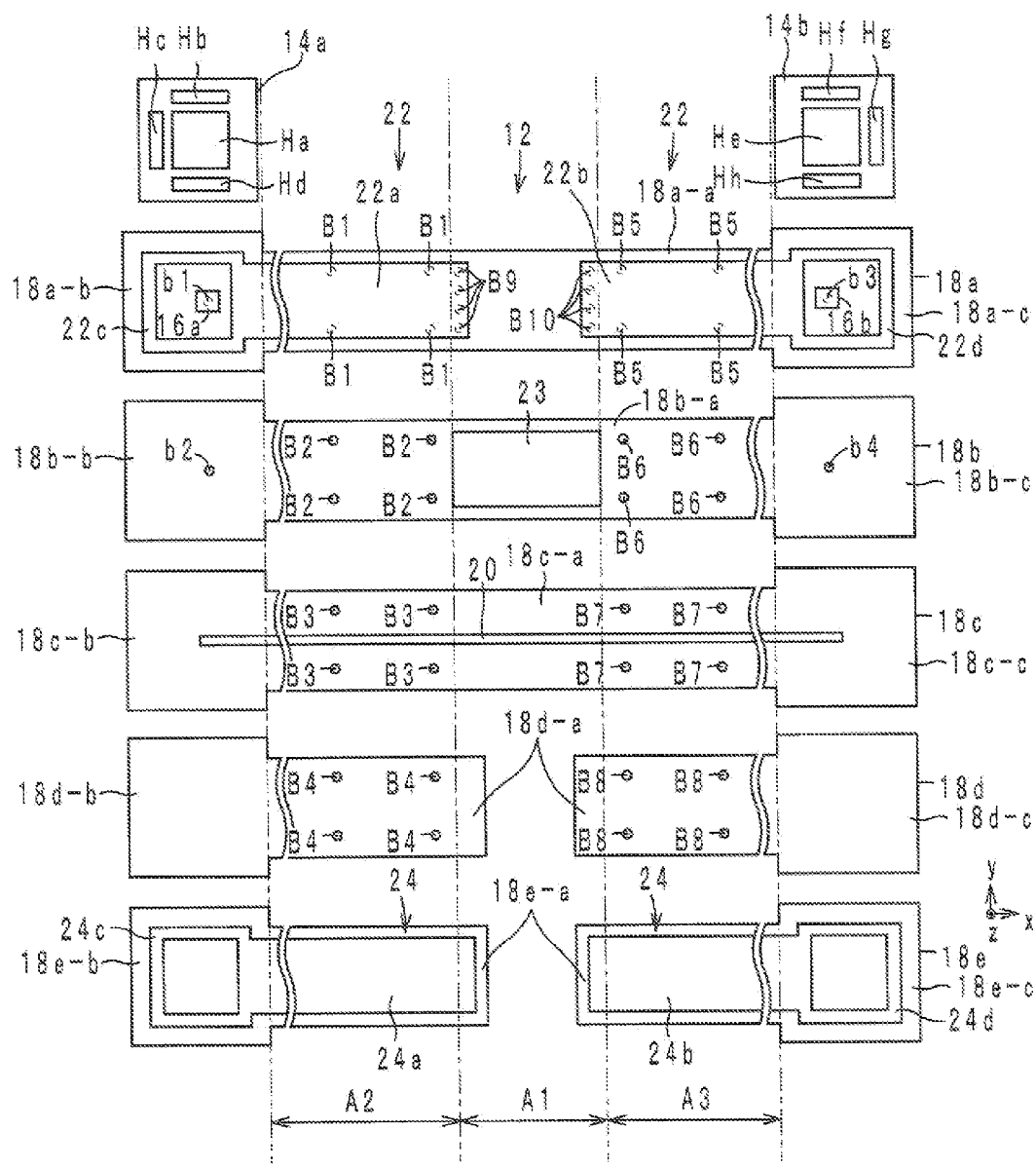
FIG. 7 is an exploded view of a high-frequency signal line according to a second modification of a preferred embodiment of the present invention.
Figure 8:
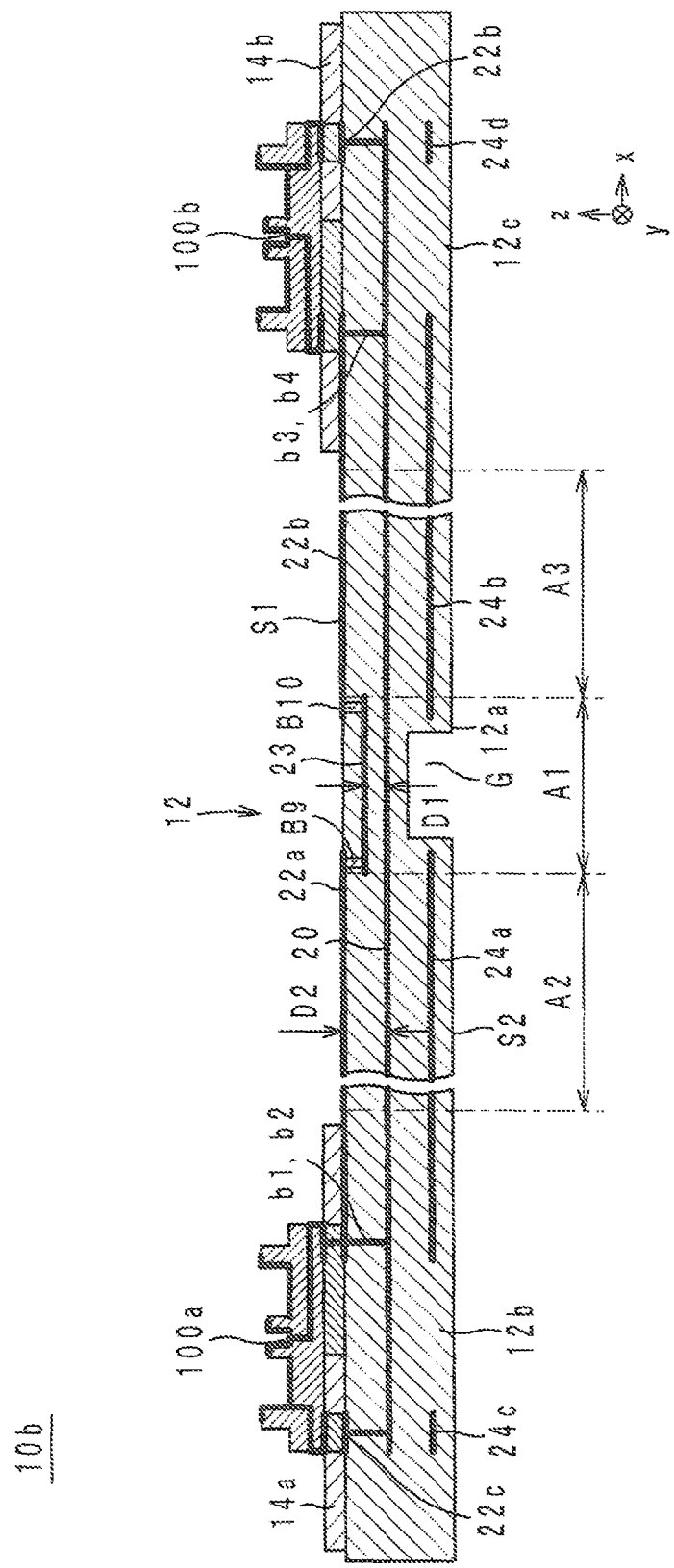
FIG. 8 is a cross-sectional structure diagram of the high-frequency signal line according to the second modification of a preferred embodiment of the present invention.

A high-frequency signal line according to a second modification of the first preferred embodiment is described below with reference to the drawings. FIG. 7 is an exploded view of a high-frequency signal line 10b according to the second modification. FIG. 8 is a cross-sectional structure diagram of the high-frequency signal line 10b according to the second modification.

The high-frequency signal line 10b differs from the high-frequency signal line 10 in that the thickness of the dielectric element body 12 at least in a portion of the region A1 is smaller than the thickness of the dielectric element body 12 in the region A2 in the high-frequency signal line 10b. The high-frequency signal line 10b is described below mainly for the different point.

As shown in FIG. 7, in the high-frequency signal line 10b, the dielectric sheets 18d and 18e located at the opposite side of the ground conductive layers 22 and 23 with respect to the signal conductive layer 20 are not provided in at least a portion of the region A1. Accordingly, as shown in FIG. 8, a recess G is provided in the region A1 at the back surface S2 of the dielectric element body 12.

The thickness of the high-frequency signal line 10b in the region A1 is smaller than the thickness of the high-frequency signal line 10 in the region A1. Accordingly, the region A1 of the high-frequency signal line 10b is more easily deformed as compared with the region A1 of the high-frequency signal line 10. As the result, the high-frequency signal line 10b can be further easily deformed.

When the high-frequency signal line 10b is bent, the recess G is preferably located at the outer periphery side.

Third Modification of First Preferred Embodiment

Figure 9:
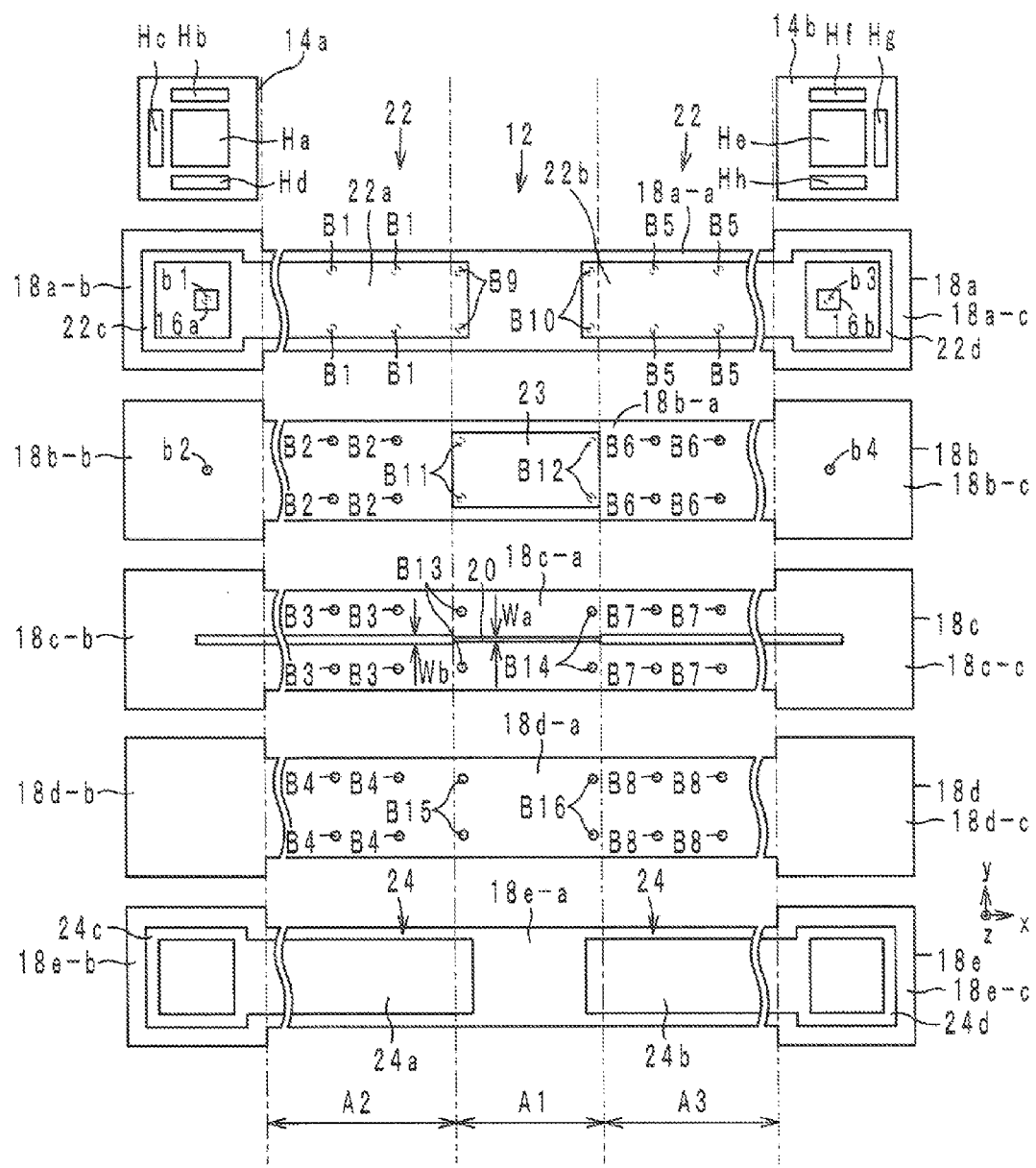
FIG. 9 is an exploded view of a high-frequency signal line according to a third modification of a preferred embodiment of the present invention.

A high-frequency signal line according to a third modification of the first preferred embodiment is described below with reference to the drawing. FIG. 9 is an exploded view of a high-frequency signal line 10c according to the third modification.

The high-frequency signal line 10c differs from the high-frequency signal line 10 in that a line width Wa of the signal conductive layer 20 in the region A1 is smaller than a line width Wb of the signal conductive layer 20 in the regions A2 and A3 in the high-frequency signal line 10c.

The distance D1 between the ground conductive layer 23 and the signal conductive layer 20 in the region A1 is smaller than the distance D2 between the ground conductive layer 22 and the signal conductive layer 20 in the regions A2 and A3. Hence, the capacitance generated between the ground conductive layer 23 and the signal conductive layer 20 in the region A1 is larger than the capacitance generated between the ground conductive layer 22 and the signal conductive layer 20 in the regions A2 and A3. Hence, the characteristic impedance in the region A1 may be deviated from the predetermined characteristic impedance.

To prevent this, in the high-frequency signal line 10c, the line width Wa of the signal conductive layer 20 in the region A1 is smaller than the line width Wb of the signal conductive layer 20 in the regions A2 and A3. Accordingly, the area per unit length in which the signal conductive layer 20 faces the ground conductive layer 23 in the region A1 is smaller than the area per unit length in which the signal conductive layer 20 faces the ground conductive layer 22 in the regions A2 and A3. Thus, the capacitance generated between the signal conductive layer 20 and the ground conductive layer 23 approaches the capacitance generated between the signal conductive layer 20 and the ground conductive layer 22. As the result, in the high-frequency signal line 10c, the characteristic impedance in the region A1 is prevented from being deviated from the predetermined characteristic impedance.

Fourth Modification of First Preferred Embodiment

A high-frequency signal line according to a fourth modification of the first preferred embodiment is described below with reference to the drawing. FIG. 10 is an exploded view of a high-frequency signal line 10d according to the fourth modification.

The high-frequency signal line 10d differs from the high-frequency signal line 10c in that the ground conductive layer 24 is provided in the region A1 in the high-frequency signal line 10d.

In the high-frequency signal line 10d, the line width Wa of the signal conductive layer 20 in the region A1 is smaller than the line width Wb of the signal conductive layer 20 in the regions A2 and A3. Accordingly, the area per unit length in which the signal conductive layer 20 faces the ground conductive layer 23 in the region A1 is smaller than the area per unit length in which the signal conductive layer 20 faces the ground conductive layer 22 in the regions A2 and A3. Hence, if the characteristic impedance in the region A1 can match the predetermined characteristic impedance, the ground conductive layer 24 may be provided in the region A1. Accordingly, radiation is prevented from being generated from the region A1.

Fifth Modification of First Preferred Embodiment

A high-frequency signal line according to a fifth modification of the first preferred embodiment is described below with reference to the drawing. FIG. 11 is an exploded view of a high-frequency signal line 10e according to the fifth modification.

The high-frequency signal line 10e differs from the high-frequency signal line 10a in that a ground conductive layer is provided (first different point), and a plurality of openings 30 are provided in the ground conductive layers 24 and (second different point) in the high-frequency signal line 10e. The high-frequency signal line 10e is described below mainly for the different points.

As shown in FIG. 11, the ground conductive layer 25 is provided in the dielectric element body 12 and faces the signal conductive layer 20. To be more specific, the ground conductive layer 25 extends in the x-axis direction in the region A1 on the front surface of the dielectric sheet 18d in the dielectric element body 12. Hence, the ground conductive layer 25 is located at the negative side in the z-axis direction with respect to the signal conductive layer 20 and at the positive side in the z-axis direction with respect to the ground conductive layer 24 in the dielectric element body 12, and faces the signal conductive layer 20 through the dielectric sheet 18c. Hence, the distance between the ground conductive layer 25 and the signal conductive layer 20 is smaller than the distance between the ground conductive layer 24 and the signal conductive layer 20.

Also, since the line portions 24a and 24b slightly protrude to the region A1, both ends in the x-axis direction of the ground conductive layer 25 overlap respective end portions of the line portions 24a and 24b. The ground conductive layer is made of a metal material mainly containing silver or copper and having a small specific resistance.

Also, the ground conductive layer 25 is connected with the ground conductive layers 22, 23, and 24 through the via-hole conductors B9 to B16. Accordingly, the ground conductive layer 25 is held at ground potential.

Further, as shown in FIG. 11, the ground conductive layers 24 and 25 have the plurality of openings 30 arranged in the x-axis direction. The openings 30 are rectangular or substantially rectangular, and are arranged in line to be evenly spaced in the x-axis direction along the signal conductive layer 20. Accordingly, the size of the capacitance generated between the signal conductive layer 20 and the ground conductive layers and 25 periodically varies. As the result, the characteristic impedance of the high-frequency signal line 10e also periodically varies.

The plurality of openings 30 can cause the characteristic impedance in that portions to be increased, like the portion without the ground conductive layer 24 in the high-frequency signal line 10. Hence, the predetermined characteristic impedance can be maintained even if the signal conductive layer 20 is arranged closely to the ground conductive layers 24 and 25. Accordingly, the thicknesses of the dielectric sheets 18c and 18d can be decreased, and as the result, the total thickness of the high-frequency signal line 10e can be decreased. Also, with this configuration, a high-frequency signal line with good bendability is obtained.

Also, with the ground conductive layers 24 and 25 including the plurality of openings 30, an advantage of preventing radiation from being generated is increased as compared with a case in which the portion without the ground conductive layer is provided like the high-frequency signal line 10.

Second Preferred Embodiment

Figure 12:
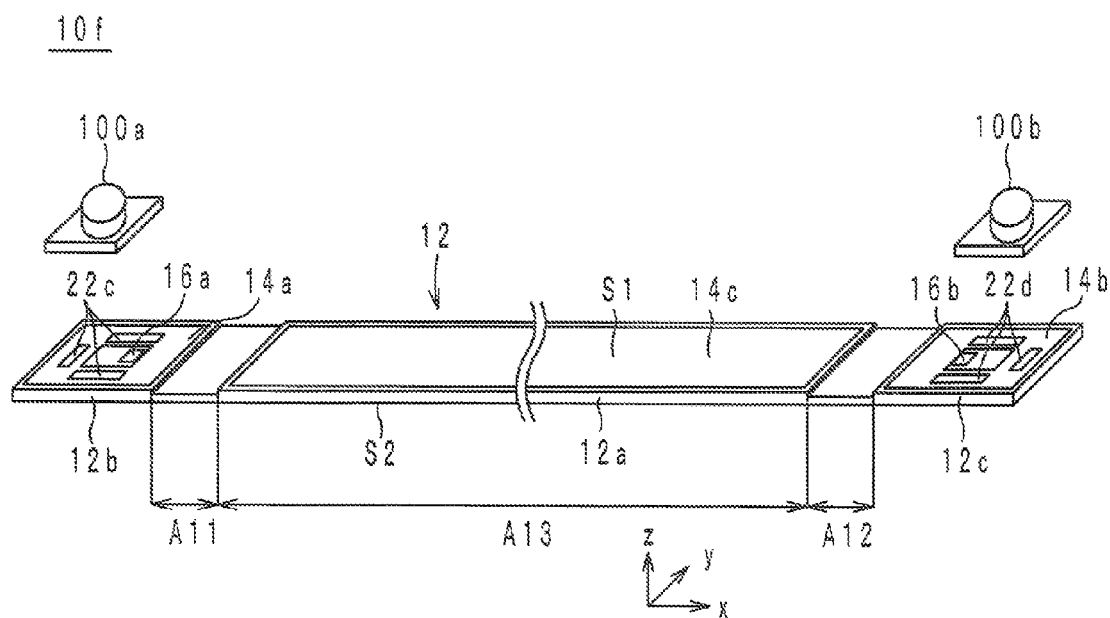
FIG. 12 is an external perspective view of a high-frequency signal line according to a second preferred embodiment of the present invention.
Figure 13:
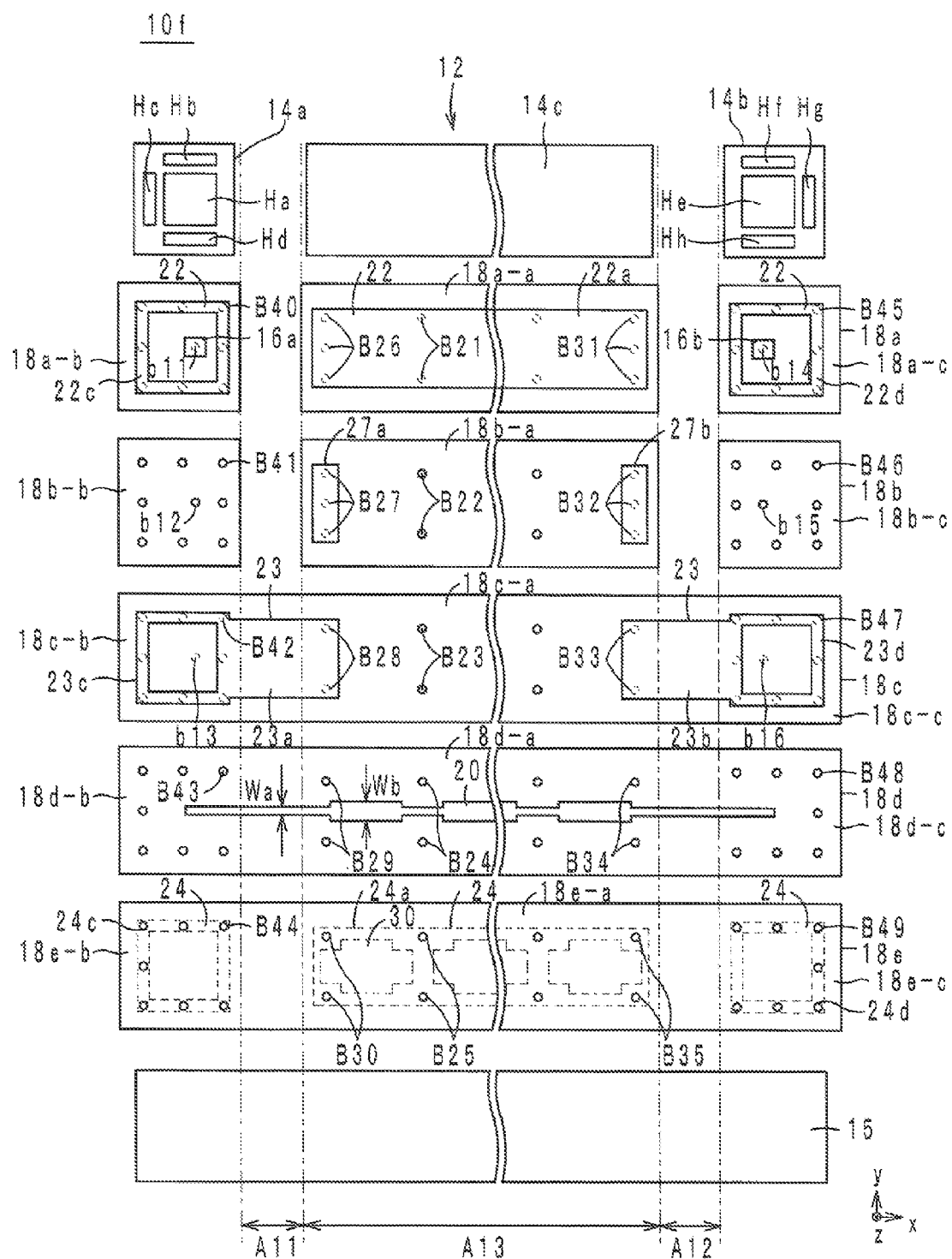
FIG. 13 is an exploded view of a dielectric element body of the high-frequency signal line in FIG. 12.
Figure 14:
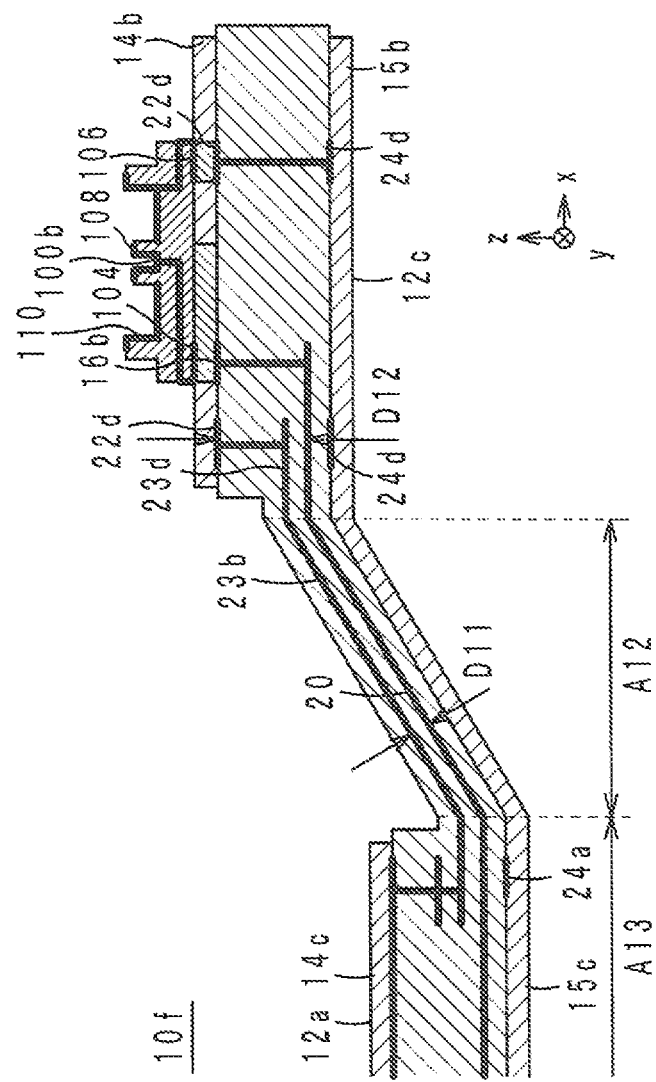
FIG. 14 is a cross-sectional structure diagram of the high-frequency signal line in FIG. 12.

A configuration of a high-frequency signal line according to a second preferred embodiment of the present invention is described below with reference to the drawings. FIG. 12 is an external perspective view of a high-frequency signal line 10f according to the second preferred embodiment of the present invention. FIG. 13 is an exploded view of a dielectric element body 12 of the high-frequency signal line 10f in FIG. 12. FIG. 14 is a cross-sectional structure diagram of the high-frequency signal line 10f in FIG. 12. In FIGS. 12 to 14, a stacking direction of the high-frequency signal line 10f is defined as the z-axis direction. Also, the longitudinal direction of the high-frequency signal line 10f is defined as the x-axis direction. A direction orthogonal to the x-axis direction and the z-axis direction is defined as the y-axis direction.

As shown in FIGS. 12 to 14, the high-frequency signal line 10f includes the dielectric element body 12, protection layers 14a to 14c and 15, external terminals 16a and 16b, a signal conductive layer 20, ground conductive layers 22, 23, and 24, reinforcement conductive layers 27a and 27b, via-hole conductors b11 to b16, B21 to B35, and B40 to B49, and connectors 100a and 100b.

The dielectric element body 12 extends in the x-axis direction in plan view in the z-axis direction, and includes a line unit 12a and connection units 12b and 12c. The dielectric element body 12 is a multilayer body preferably formed by stacking dielectric sheets (insulating layers) 18a to 18e in that order from the positive side to the negative side in the z-axis direction. In the following description, the principal surface at the positive side in the z-axis direction of the dielectric element body 12 is called a front surface S1, and the principal surface at the negative side in the z-axis direction of the dielectric element body 12 is called a back surface S2.

The line unit 12a extends in the x-axis direction. As shown in FIGS. 12 and 13, the line unit 12a includes regions A11 to A13. The region A11 is located at an end portion at the negative side in the x-axis direction of the line unit 12a. The region A12 is located at an end portion at the positive side in the x-axis direction of the line unit 12a. The region A13 is sandwiched between the regions A11 and A12 from both sides in the x-axis direction.

The connection units 12b and 12c are connected with an end portion at the negative side in the x-axis direction and an end portion at the positive side in the x-axis direction of the line unit 12a, respectively. Hence, the region A11 is adjacent to the connection unit 12b. Also, the region A12 is adjacent to the connection unit 12c. The widths in the y-axis direction of the connection units 12b and 12c are equivalent to the width in the y-axis direction of the line unit 12a. Hence, the dielectric element body 12 has a rectangular or substantially rectangular shape extending in the x-axis direction in plan view in the z-axis direction.

The dielectric sheets 18 extend in the x-axis direction and have the same shape as the shape of the dielectric element body 12 in plan view in the z-axis direction. The dielectric sheets 18 are made of flexible thermoplastic resin, such as polyimide or a liquid crystal polymer. The thickness of the stacked dielectric sheets 18a to 18c preferably is about 50 μm, for example. The thickness of the stacked dielectric sheets 18d and 18e preferably is about 25 μm, for example. In the following description, the principal surface at the positive side in the z-axis direction of each of the dielectric sheets 18 (18a to 18e) is called a front surface, and the principal surface at the negative side in the z-axis direction of each of the dielectric sheets 18 is called a back surface.

Also, the dielectric sheet 18a includes a line portion 18a-a, and connection portions 18a-b and 18a-c. The dielectric sheet 18b includes a line portion 18b-a, and connection portions 18b-b and 18b-c. The dielectric sheet 18c includes a line portion 18c-a, and connection portions 18c-b and 18c-c. The dielectric sheet 18d includes a line portion 18d-a, and connection portions 18d-b and 18d-c. The dielectric sheet 18e includes a line portion 18e-a, and connection portions 18e-b and 18e-c. The line portions 18a-a, 18b-a, 18c-a, 18d-a, and 18e-a define the line unit 12a. The connection portions 18a-b, 18b-b, 18c-b, 18d-b, and 18e-b define the connection unit 12b. The connection portions 18a-c, 18b-c, 18c-c, 18d-c, and 18e-c define the connection unit 12c.

As shown in FIGS. 12 and 13, the external terminal 16a is a rectangular or substantially rectangular conductor provided near the center of the front surface of the connection portion 18a-b. As shown in FIGS. 12 and 13, the external terminal 16b is a rectangular or substantially rectangular conductor provided near the center of the front surface of the connection portion 18a-c. The external terminals 16a and 16b are made of a metal material mainly containing silver or copper and having a small specific resistance. Also, the front surfaces of the external terminals 16a and 16b preferably are processed by gold plating.

As shown in FIG. 13, the signal conductive layer 20 is a line-shaped conductive layer provided in the dielectric element body 12. The signal conductive layer 20 extends in the x-axis direction on the front surface of the dielectric sheet 18d. Both ends of the signal conductive layer 20 overlap the respective external terminals 16a and 16b in plan view in the z-axis direction. The line width of the signal conductive layer 20 periodically varies between a line width Wa and a line width Wb in the region A13. Also, the line width of the signal conductive layer 20 is the line width Wa in the regions A11 and A12. The signal conductive layer 20 is made of a metal material mainly containing silver or copper and having a small specific resistance.

The via-hole conductor b11 penetrates through the connection portion 18a-b of the dielectric sheet 18a in the z-axis direction. The via-hole conductor b12 penetrates through the connection portion 18b-b of the dielectric sheet 18b in the z-axis direction. The via-hole conductor b13 penetrates through the connection portion 18c-b of the dielectric sheet 18c in the z-axis direction. The via-hole conductors b11 to b13 are connected with each other and define a single via-hole conductor. The via-hole conductor connects the external terminal 16a with an end portion at the negative side in the x-axis direction of the signal conductive layer 20. The via-hole conductors b11 to b13 are made of a metal material mainly containing silver or copper and having a small specific resistance.

The via-hole conductor b14 penetrates through the connection portion 18a-c of the dielectric sheet 18a in the z-axis direction. The via-hole conductor b15 penetrates through the connection portion 18b-c of the dielectric sheet 18b in the z-axis direction. The via-hole conductor b16 penetrates through the connection portion 18c-c of the dielectric sheet 18c in the z-axis direction. The via-hole conductors b14 to b16 are connected with each other and define a single via-hole conductor. The via-hole conductor connects the external terminal 16b with an end portion at the positive side in the x-axis direction of the signal conductive layer 20. The via-hole conductors b14 to b16 are made of a metal material mainly containing silver or copper and having a small specific resistance.

As shown in FIG. 13, the ground conductive layer 22 is provided on the dielectric element body 12 and faces the signal conductive layer 20. To be more specific, in the dielectric element body 12, the ground conductive layer 22 is provided on the front surface of the dielectric sheet 18a being the closest to the front surface S1 of the dielectric element body 12. Hence, the ground conductive layer 22 is located at the positive side in the z-axis direction with respect to the signal conductive layer 20 in the dielectric element body 12, and faces the signal conductive layer 20 through the dielectric sheets 18a to 18c. The ground conductive layer 22 is made of a metal material mainly containing silver or copper and having a small specific resistance. Further, the front surface of the ground conductive layer 22 preferably is processed with gold plating or the like for rust prevention.

Also, the ground conductive layer 22 includes a line portion 22a, and terminal portions 22c and 22d. The line portion 22a is provided in the region A13 on the front surface of the line portion 18a-a, and extends in the x-axis direction. The terminal portion 22c is provided on the front surface of the connection portion 18a-b, and has a rectangular or substantially rectangular ring shape surrounding the periphery of the external terminal 16a. The terminal portion 22c is not connected with the line portion 22a. The terminal portion 22d is provided on the front surface of the connection portion 18a-c, and has a rectangular or substantially rectangular ring shape surrounding the periphery of the external terminal 16b. The terminal portion 22d is not connected with the line portion 22a.

As shown in FIG. 13, the ground conductive layer 23 is provided in the dielectric element body 12 and faces the signal conductive layer 20. To be more specific, the ground conductive layer 23 is provided on the front surface of the dielectric sheet 18c in the dielectric element body 12. Hence, the ground conductive layer 23 is located at the positive side in the z-axis direction with respect to the signal conductive layer 20 and at the negative side in the z-axis direction with respect to the ground conductive layer 22 in the dielectric element body 12, and faces the signal conductive layer 20 through the dielectric sheet 18c. Hence, as shown in FIG. 14, a distance D11 between the ground conductive layer 23 and the signal conductive layer 20 is smaller than a distance D12 between the ground conductive layer 22 and the signal conductive layer 20.

Also, the ground conductive layer 23 includes line portions 23a and 23b, and terminal portions 23c and 23d. The line portion 23a is provided in the region A11 on the front surface of the line portion 18c-a, and extends in the x-axis direction. However, the line portion 23a slightly protrudes to the region A13 on the front surface of the line portion 18c-a. Hence, the line portion 23a overlaps an end portion at the negative side in the x-axis direction of the line portion 22a in plan view in the z-axis direction. The line portion 23b is provided in the region A12 on the front surface of the line portion 18c-a, and extends in the x-axis direction. However, the line portion 23b slightly protrudes to the region A13 on the front surface of the line portion 18c-a. Hence, the line portion 23b overlaps an end portion at the positive side in the x-axis direction of the line portion 22a in plan view in the z-axis direction.

The terminal portion 23c is provided on the front surface of the connection portion 18c-b, and has a rectangular or substantially rectangular ring shape, similarly to the terminal portion 22c. The terminal portion 23c is connected with an end portion at the negative side in the x-axis direction of the line portion 23a. The terminal portion 23d is provided on the front surface of the connection portion 18c-c, and has a rectangular or substantially rectangular ring shape, similarly to the terminal portion 22d. The terminal portion 22d is connected with an end portion at the positive side in the x-axis direction of the line portion 23b. The ground conductive layer is made of a metal material mainly containing silver or copper and having a small specific resistance.

The reinforcement conductive layer 27a is provided near an end portion at the negative side in the x-axis direction of the line portion 18b-a of the dielectric sheet 18b. The reinforcement conductive layer 27a overlaps an end portion at the negative side in the x-axis direction of the line portion 22a and an end portion at the positive side in the x-axis direction of the line portion 23a in plan view in the z-axis direction.

The reinforcement conductive layer 27b is provided near an end portion at the positive side in the x-axis direction of the line portion 18b-a of the dielectric sheet 18b. The reinforcement conductive layer 27b overlaps an end portion at the positive side in the x-axis direction of the line portion 22a and an end portion at the negative side in the x-axis direction of the line portion 23b in plan view in the z-axis direction.

Three via-hole conductors B26 are provided in line in the y-axis direction, and penetrate through the dielectric sheet 18a in the z-axis direction. Three via-hole conductors B27 are provided in line in the y-axis direction, and penetrate through the dielectric sheet 18b in the z-axis direction. The via-hole conductors B26 and B27 are connected with each other, and connect the end portion at the negative side in the x-axis direction of the line portion 22a, the reinforcement conductive layer 27a, and the end portion at the positive side in the x-axis direction of the line portion 23a, together.

Three via-hole conductors B31 are provided in line in the y-axis direction, and penetrate through the dielectric sheet 18a in the z-axis direction. Three via-hole conductors B32 are provided in line in the y-axis direction, and penetrate through the dielectric sheet 18b in the z-axis direction. The via-hole conductors B31 and B32 are connected with each other, and connect the end portion at the positive side in the x-axis direction of the line portion 22a, the reinforcement conductive layer 27b, and the end portion at the negative side in the x-axis direction of the line portion 23b, together. Hence, the ground conductive layers 22 and 23 define a first ground conductive layer provided in the dielectric element body 12, and facing the signal conductive layer 20.

As shown in FIG. 13, the ground conductive layer 24 is provided on the dielectric element body 12 and faces the ground conductive layers 22 and 23 through the signal conductive layer 20. To be more specific, in the dielectric element body 12, the ground conductive layer 24 extends in the x-axis direction on the back surface of the dielectric sheet 18e being the closest to the back surface S2 of the dielectric element body 12. Hence, the ground conductive layer 24 is located at the negative side in the z-axis direction with respect to the signal conductive layer 20 in the dielectric element body 12, and faces the signal conductive layer 20 through the dielectric sheets 18d and 18e. The ground conductive layer 24 is made of a metal material mainly containing silver or copper and having a small specific resistance.

Also, the ground conductive layer 24 includes a line portion 24a, and terminal portions 24c and 24d. The line portion 24a is provided in the region A13 on the back surface of the line portion 18e-a, and extends in the x-axis direction. Also, the line portion 24a has a plurality of openings 30 arranged in the x-axis direction along the signal conductive layer 20. As shown in FIG. 13, the openings 30 each preferably have a cross shape. That is, each opening 30 has a shape in which the width in the y-axis direction at the center in the x-axis direction is relatively large, and the width in the y-axis direction at both ends in the x-axis direction is relatively small. In FIG. 13, only three openings 30 are arranged. However, many openings 30 are actually arranged.

The terminal portion 24c is provided on the back surface of the connection portion 18e-b, and has a rectangular or substantially rectangular ring shape, similarly to the terminal portion 22c. The terminal portion 24c is not connected with the line portion 24a. The terminal portion 24d is provided on the back surface of the connection portion 18e-c, and has a rectangular or substantially rectangular ring shape, similarly to the terminal portion 22d. The terminal portion 24d is not connected with the line portion 24a.

As described above, the signal conductive layer 20 is sandwiched between the ground conductive layers 22 and 23, and the ground conductive layer 24 from both sides in the z-axis direction. That is, the signal conductive layer 20 and the ground conductive layers 22, 23, and 24 define a triplate stripline structure except for a portion in the regions A11 and A12.

In this preferred embodiment, the high-frequency signal line 10f includes the ground conductive layer 24. However, the ground conductive layer 24 may not be provided. That is, the ground conductive layers 22 and 23, and the signal conductive layer 20 may define a high-frequency signal line having a microstripline structure. However, to prevent radiation from being generated, a triplate stripline structure such as the high-frequency signal line 10f may be preferably provided.

A plurality of the via-hole conductors B21 penetrate through the line portion 18a-a of the dielectric sheet 18a in the z-axis direction. A plurality of the via-hole conductors B22 penetrate through the line portion 18b-a of the dielectric sheet 18b in the z-axis direction. A plurality of the via-hole conductors B23 penetrate through the line portion 18c-a of the dielectric sheet 18c in the z-axis direction. A plurality of the via-hole conductors B24 penetrate through the line portion 18d-a of the dielectric sheet 18d in the z-axis direction. A plurality of the via-hole conductors B25 penetrate through the line portion 18e-a of the dielectric sheet 18e in the z-axis direction. The via-hole conductors B21 to B25 are connected with each other and define a single via-hole conductor. The single via-hole conductor connects the line portion 22a with the line portion 24a. The via-hole conductors B21 to B25 are made of a metal material mainly containing silver or copper and having a small specific resistance.

Two via-hole conductors B28 are provided in line in the y-axis direction, and penetrate through the dielectric sheet 18c in the z-axis direction. Two via-hole conductors B29 are provided in line in the y-axis direction, and penetrate through the dielectric sheet 18d in the z-axis direction. Two via-hole conductors B30 are provided in line in the y-axis direction, and penetrate through the dielectric sheet 18e in the z-axis direction. The via-hole conductors B28 to B30 are connected with each other, and connect the end portion at the positive side in the x-axis direction of the line portion 23a with an end portion at the negative side in the x-axis direction of the line portion 24a. The via-hole conductors B28 to B30 are made of a metal material mainly containing silver or copper and having a small specific resistance.

Two via-hole conductors B33 are provided in line in the y-axis direction, and penetrate through the dielectric sheet 18c in the z-axis direction. Two via-hole conductors B34 are provided in line in the y-axis direction, and penetrate through the dielectric sheet 18d in the z-axis direction. Two via-hole conductors B35 are provided in line in the y-axis direction, and penetrate through the dielectric sheet 18e in the z-axis direction. The via-hole conductors B33 to B35 are connected with each other, and connect the end portion at the negative side in the x-axis direction of the line portion 23b with an end portion at the positive side in the x-axis direction of the line portion 24a. The via-hole conductors B33 to B35 are made of a metal material mainly containing silver or copper and having a small specific resistance.

The via-hole conductor B40 penetrates through the connection portion 18a-b of the dielectric sheet 18a in the z-axis direction. The via-hole conductor B41 penetrates through the connection portion 18b-b of the dielectric sheet 18b in the z-axis direction. The via-hole conductor B42 penetrates through the connection portion 18c-b of the dielectric sheet 18c in the z-axis direction. The via-hole conductor B43 penetrates through the connection portion 18d-b of the dielectric sheet 18d in the z-axis direction. The via-hole conductor B44 penetrates through the connection portion 18e-b of the dielectric sheet 18e in the z-axis direction. The via-hole conductors B40 to B44 are connected with each other, and connect the terminal portions 22c, 23c, and 24c with each other. The via-hole conductors B40 to B44 are made of a metal material mainly containing silver or copper and having a small specific resistance.

The via-hole conductor B45 penetrates through the connection portion 18a-c of the dielectric sheet 18a in the z-axis direction. The via-hole conductor B46 penetrates through the connection portion 18b-c of the dielectric sheet 18b in the z-axis direction. The via-hole conductor B47 penetrates through the connection portion 18c-c of the dielectric sheet 18c in the z-axis direction. The via-hole conductor B48 penetrates through the connection portion 18d-c of the dielectric sheet 18d in the z-axis direction. The via-hole conductor B49 penetrates through the connection portion 18e-c of the dielectric sheet 18e in the z-axis direction. The via-hole conductors B45 to B49 are connected with each other, and connect the terminal portions 22d, 23d, and 24d with each other. The via-hole conductors B45 to B49 are made of a metal material mainly containing silver or copper and having a small specific resistance.

The protection layer 14a covers the front surface of the connection portion 18a-b. However, the protection layer 14a includes openings Ha to Hd. The opening Ha is a rectangular or substantially rectangular opening provided at the center of the protection layer 14a. The external terminal 16a is exposed to the outside through the opening Ha. Also, the opening Hb is a rectangular or substantially rectangular opening provided at the positive side in the y-axis direction of the opening Ha. The opening Hc is a rectangular or substantially rectangular opening provided at the negative side in the x-axis direction of the opening Ha. The opening Hd is a rectangular or substantially rectangular opening provided at the negative side in the y-axis direction of the opening Ha. The terminal portion 22c is exposed to the outside through the openings Hb to Hd, and hence functions as an external terminal. The protection layer 14a is made of, for example, flexible resin, such as a resist material.

The protection layer 14b covers the front surface of the connection portion 18a-c. However, the protection layer 14b includes openings He to Hh. The opening He is a rectangular or substantially rectangular opening provided at the center of the protection layer 14b. The external terminal 16b is exposed to the outside through the opening He. Also, the opening Hf is a rectangular or substantially rectangular opening provided at the positive side in the y-axis direction of the opening Ha. The opening Hg is a rectangular or substantially rectangular opening provided at the positive side in the x-axis direction of the opening He. The opening Hh is a rectangular or substantially rectangular opening provided at the negative side in the y-axis direction of the opening He. The terminal portion 22d is exposed to the outside through the openings Hf to Hh, and hence functions as an external terminal. The protection layer 14b is made of, for example, flexible resin, such as a resist material.

A protection layer 14c is provided on the front surface of the line portion 18a-a, and covers the line portion 18a-a. The protection layer 14c is made of, for example, flexible resin, such as a resist material.

The protection layer 15 is provided on the back surface of the dielectric sheet 18e, and covers the entire surface of the ground conductive layer 24. The protection layer is made of, for example, flexible resin, such as a resist material.

The configurations of the connectors 100a and 100b of the high-frequency signal line 10f according to this preferred embodiment are similar to those of the connectors 100a and 100b of the high-frequency signal line 10 according to the first preferred embodiment, and hence the description is omitted.

Figure 15A:
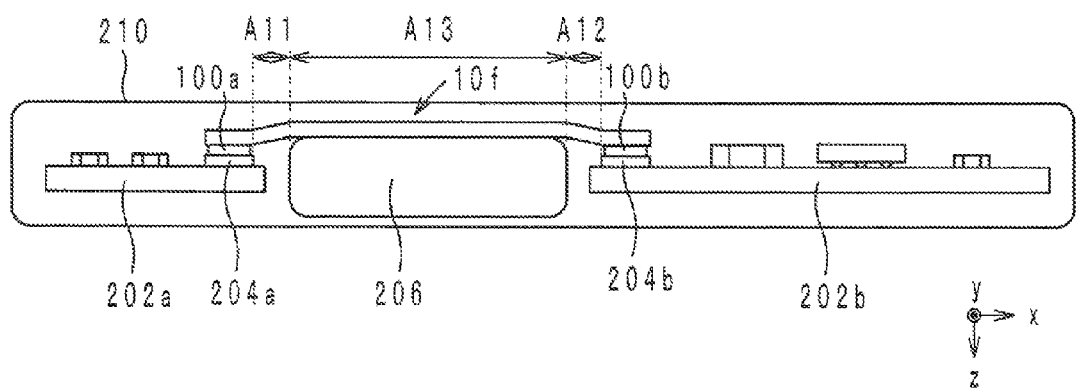
FIGS. 15A and 15B are illustrations showing an example when the high-frequency signal line is attached to an electronic device.
Figure 15B:
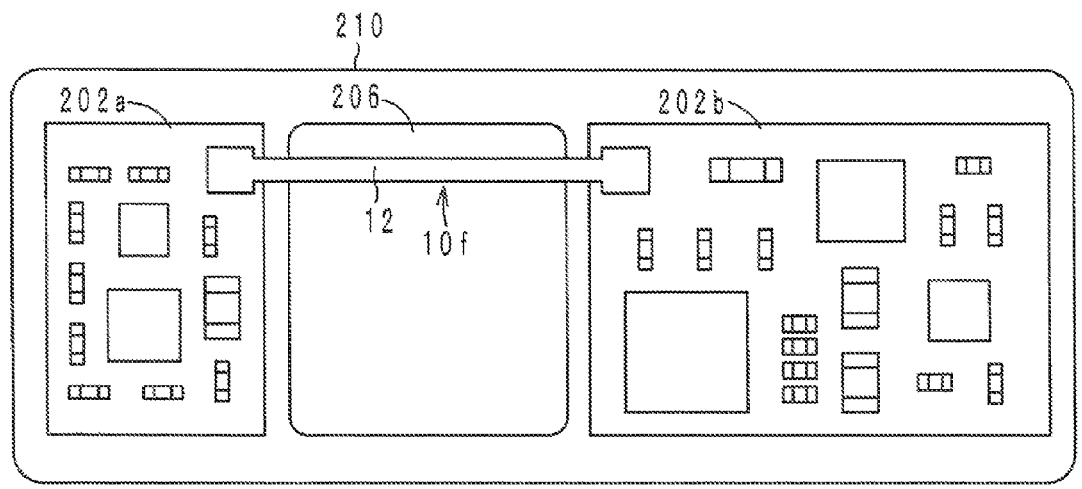

The high-frequency signal line 10f is bent when being used. FIGS. 15A and 15B are illustrations each showing an example when the high-frequency signal line 10f is attached to an electronic device 200.

The electronic device 200 includes the high-frequency signal line 10f, circuit boards 202a and 202b, receptacles 204a and 204b, a battery pack (metal body) 206, and a casing 210.

The circuit board 202a includes, for example, a transmitting circuit having an antenna, or a receiving circuit having an antenna. The circuit board 202b includes, for example, a feeding circuit. The battery pack 206 is, for example, a lithium ion secondary battery, and has a structure in which the surface of the battery pack 206 is covered with a metal cover. The circuit board 202a, the battery pack 206, and the circuit board 202b are arranged in that order from the negative side to the positive side in the x-axis direction.

The front surface of the high-frequency signal line 10f (more correctly, the protection layer 14) contacts the battery pack 206. The front surface of the dielectric element body 12 and the battery pack 206 are fixed together by an adhesive or the like.

The receptacles 204a and 204b are provided on the principal surfaces at the negative side in the z-axis direction of the circuit boards 202a and 202b, respectively. The connectors 100a and 100b are connected to the receptacles 204a and 204b, respectively. Accordingly, high-frequency signals having a frequency of, for example, 2 GHz, the signals which are transmitted between the circuit boards 202a and 202b are applied to the central conductors 108 of the connectors 100a and 100b through the receptacle 204a and 204b. Also, the external conductors 110 of the connectors 100a and 100b are held at ground potential through the circuit boards 202a and 202b, and the receptacles 204a and 204b. Hence, the high-frequency signal line 10f connects the circuit boards 202a and 202b with each other.

In this case, a step is present between the principal surface at the negative side in the z-axis direction of the battery pack 206 and the receptacle 204a, and between that principal surface and the receptacle 204b. As shown in FIGS. 14, 15A, and 15B, both ends of the line unit 12a of the dielectric element body 12 (that is, the regions A11 and A12) are bent, and hence the connectors 100a and 100b are connected to the receptacles 204a and 204b, respectively.

With the high-frequency signal line 10f according to the second preferred embodiment, similarly to the high-frequency signal line 10, the high-frequency signal line 10f can be easily bent. Also, with the high-frequency signal line 10f, similarly to the high-frequency signal line 10, the ground conductive layers 22 and 23 are prevented from being broken when the high-frequency signal line 10f is bent. Also, with the high-frequency signal line 10f, similarly to the high-frequency signal line 10, the characteristic impedance of the signal conductive layer 20 is prevented from being deviated from the predetermined characteristic impedance. Also, with the high-frequency signal line 10f, similarly to the high-frequency signal line 10, the characteristic impedance in the regions A11 and A12 is prevented from being deviated from the predetermined characteristic impedance.

Also, with the high-frequency signal line 10f, the characteristic impedance of the signal conductive layer 20 is prevented from varying. To be more specific, in the high-frequency signal line 10f, the regions A11 and A12 are located at both ends in the x-axis direction of the line unit 12a. Accordingly, the structure of the line unit 12a is uniform in a portion excluding both ends of the line unit 12a (that is, the region A13). Hence, the characteristic impedance of the signal conductive layer 20 is prevented from varying in the region A13 of the line unit 12a. Further, the region A11 is adjacent to the connection unit 12b, and the region A12 is adjacent to the connection unit 12c. Therefore, by adjusting the characteristic impedances of the connection units 12b and 12c and the characteristic impedances of the connectors 100a and 100b, the characteristic impedance of the signal conductive layer 20 in the regions A11 and A12 is adjusted. A specific adjustment method may be, for example, changing the line width of the signal conductive layer 20 in the regions A11 and A12, and adjusting the distance between the signal conductive layer 20 and the ground conductive layer 23. The characteristic impedances of the connection units 12b and 12c and the characteristic impedances of the connectors 100a and 100b are adjusted by any of these methods. Accordingly, the characteristic impedance of the signal conductive layer 20 in the regions A11 and A12 can approach the characteristic impedance of the signal conductive layer 20 in the region A13. As described above, in the high-frequency signal line 10f, the characteristic impedance of the signal conductive layer 20 is prevented from varying, and adjustment of the characteristic impedance (matching) is easily executed.

Also, with the high-frequency signal line 10f, the characteristic impedance of the signal conductive layer 20 is prevented from varying even by the following reason. To be more specific, if the regions A11 and A12, in which the ground conductive layer 22 or 24 is not provided, contacts the battery pack 206, the characteristic impedance of the signal conductive layer 20 likely varies. Hence, in the high-frequency signal line 10f, the regions A11 and A12 are located at both ends in the x-axis direction of the line unit 12a. Accordingly, as shown in FIGS. 15A and 15B, the regions A11 and A12 do not contact the battery pack 206, or do not come close to the battery pack 206. As the result, with the high-frequency signal line 10f, the characteristic impedance of the signal conductive layer 20 is prevented from varying.

Also, the high-frequency signal line 10f has the openings 30 in the ground conductive layer 24. Hence, to prevent the capacitance generated between the signal conductive layer 20 and the ground conductive layer 24 from being excessively small, the distance between the signal conductive layer 20 and the ground conductive layer 24 is preferably set to be smaller than the distance between the signal conductive layer and the ground conductive layer 22. In this case, the thickness of the dielectric sheets 18a to 18c provided at the positive side in the z-axis direction with respect to the signal conductive layer 20 is larger than the thickness of the dielectric sheets 18d and 18e provided at the negative side in the z-axis direction with respect to the signal conductive layer 20. Hence, in the regions A11 and A12, the portions of the dielectric sheets 18a and 18b provided at the side of the ground conductive layer 22 (that is, at the positive side in the z-axis direction) with respect to the signal conductive layer 20 are not provided. Accordingly, the thickness of the high-frequency signal line 10f in the regions A11 and A12 of the high-frequency signal line 10f is advantageously decreased. As the result, the high-frequency signal line 10f can be easily bent.

Also, the high-frequency signal line 10f has the reinforcement conductive layers 27a and 27b. Accordingly, both ends in the x-axis direction of the line unit 12a are prevented from being deformed.

Modification of Second Preferred Embodiment

Figure 16:
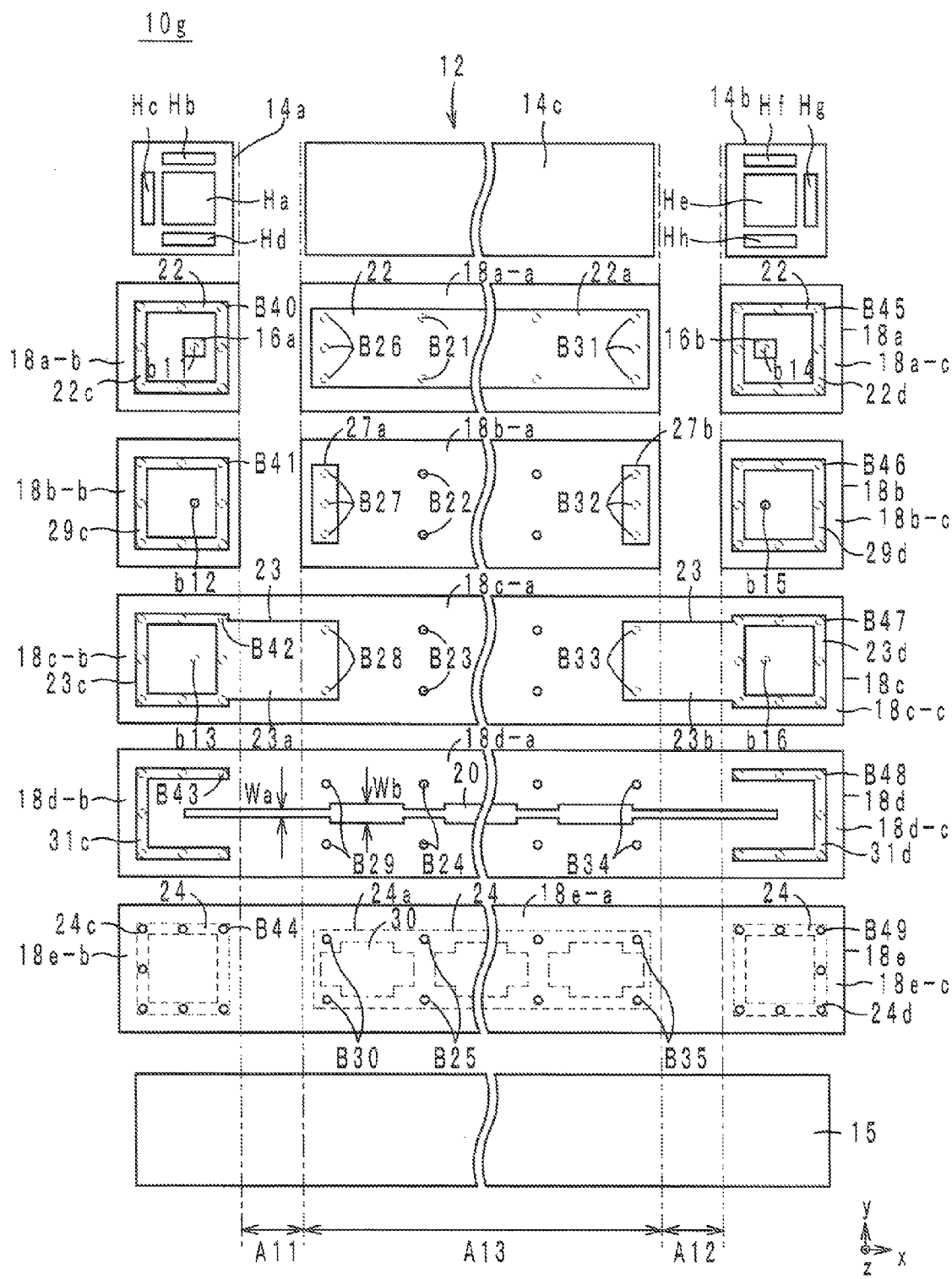
FIG. 16 is an exploded view of a dielectric element body of a high-frequency signal line according to a modification of a preferred embodiment of the present invention.

A high-frequency signal line 10g according to a modification of the preferred embodiment is described below with reference to the drawing. FIG. 16 is an exploded view of a dielectric element body 12 of the high-frequency signal line 10g according to the modification.

The high-frequency signal line 10g differs from the high-frequency signal line 10f in that terminal portions 29c, 29d, 31c, and 31d are provided. The terminal portion 29c is provided on the front surface of the connection portion 18b-b, and has a rectangular or substantially rectangular ring shape, similarly to the terminal portion 22c. The terminal portion 29d is provided on the front surface of the connection portion 18b-c, and has a rectangular or substantially rectangular ring shape, similarly to the terminal portion 22d.

The terminal portion 31c is provided on the front surface of the connection portion 18d-b and has an angular C shape being open at the positive side in the x-axis direction. The terminal portion 31c overlaps the terminal portion 29c in plan view in the z-axis direction. The terminal portion 31d is provided on the front surface of the connection portion 18d-c and has an angular C shape being open at the negative side in the x-axis direction. The terminal portion 31d overlaps the terminal portion 29d in plan view in the z-axis direction.

With the high-frequency signal line 10g configured as described above, the same operation and advantage as those of the high-frequency signal line 10f can be attained. Further, since the high-frequency signal line 10g includes the terminal portions 29c, 29d, 31c, and 31d in the connection units 12b and 12c, the connection units 12b and 12c are less likely deformed. As the result, when the connectors 100a and 100b are attached to the receptacles 204a and 204b, respectively, a situation, in which a large force is applied to the connection units 12b and 12c and the connection units 12b and 12c are significantly deformed and broken, is prevented from occurring.

Third Preferred Embodiment

Figure 17:
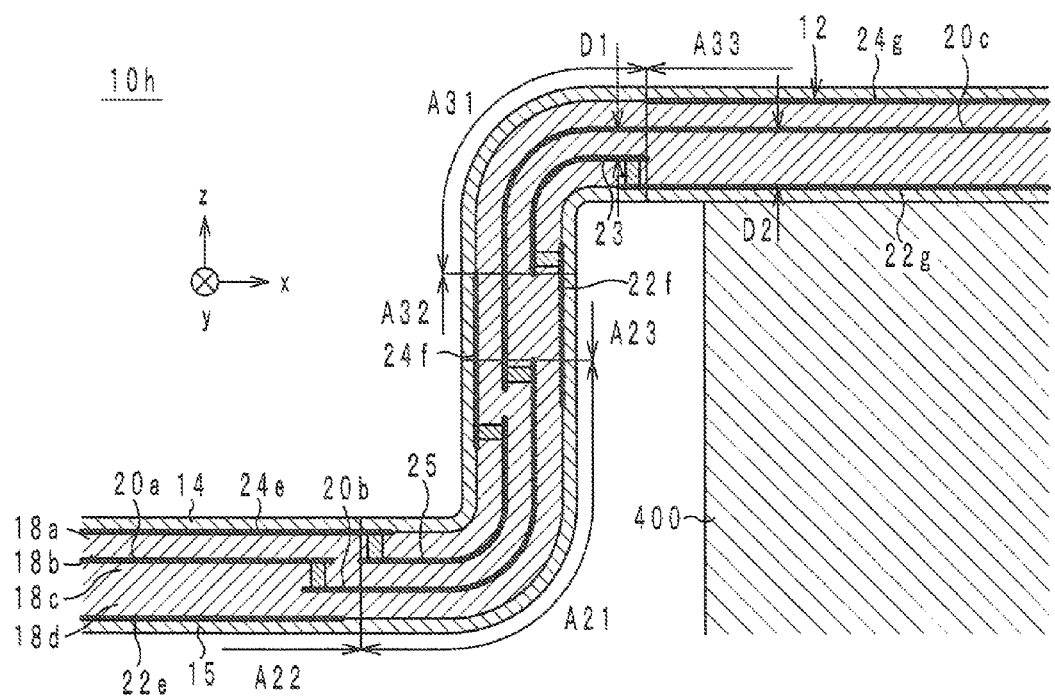
FIG. 17 is a cross-sectional structure diagram of a high-frequency signal line according to a third preferred embodiment of the present invention.
Figure 19:
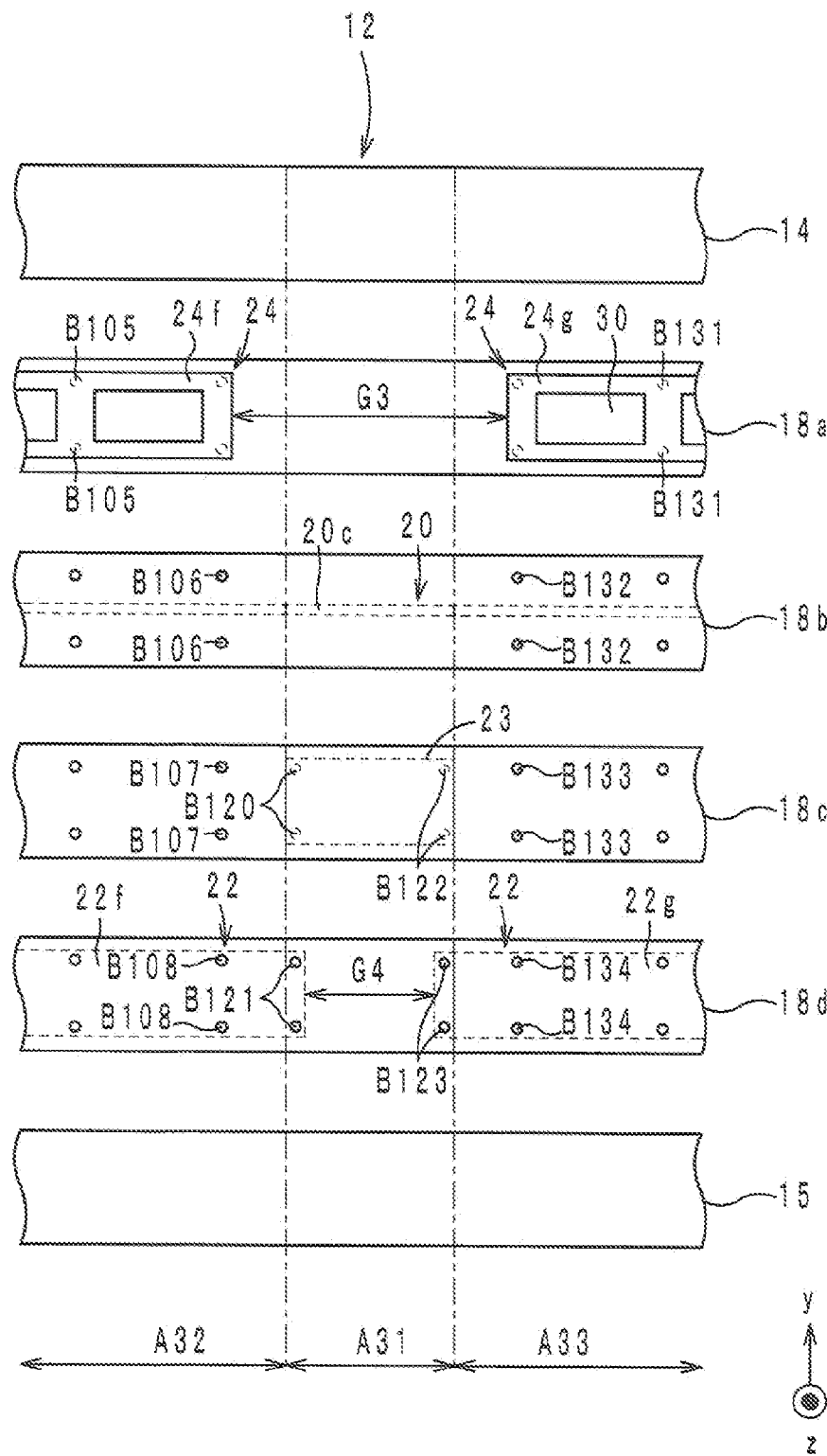
FIG. 19 is an exploded view of a portion of the high-frequency signal line in FIG. 17, the portion being bent in a mountain form.
Figure 20A:
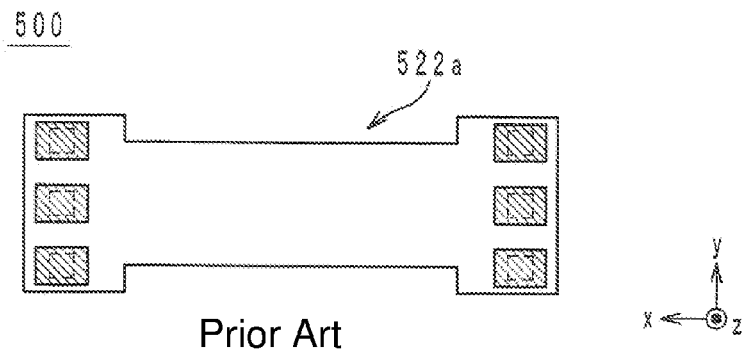
FIGS. 20A to 20D provide an exploded view of a signal line described in Japanese Unexamined Patent Application Publication No. 2011-71403.
Figure 20B:
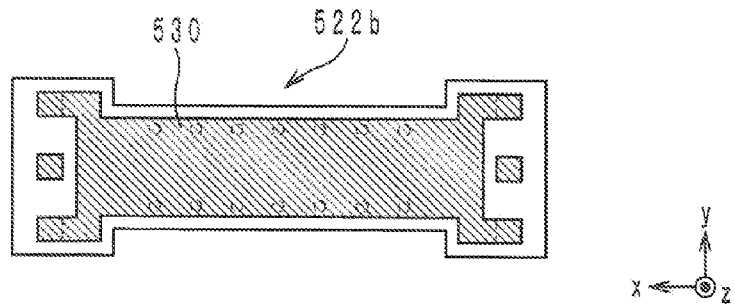
Figure 20C:
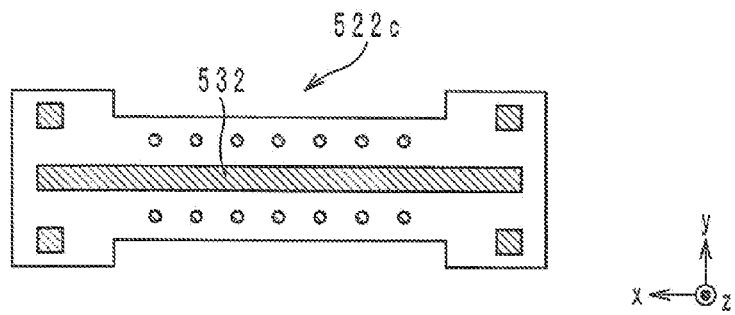
Figure 20D:
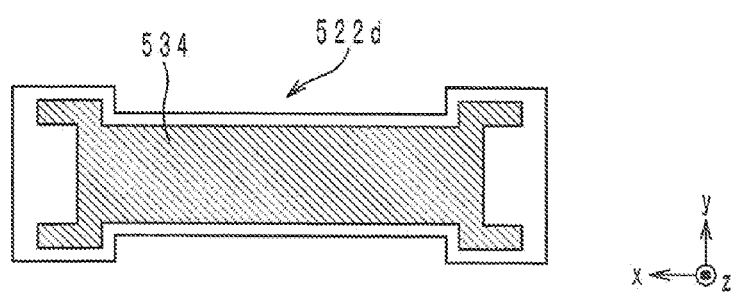

A configuration of a high-frequency signal line according to a third preferred embodiment of the present invention is described below with reference to the drawings. FIG. 17 is a cross-sectional structure diagram of a high-frequency signal line 10h according to the third preferred embodiment of the present invention. FIG. 18 is an exploded view of a portion of the high-frequency signal line 10h in FIG. 17, the portion being bent in a valley configuration. FIG. 19 is an exploded view of a portion of the high-frequency signal line 10h in FIG. 17, the portion being bent in a mountain configuration. In FIGS. 17 to 19, a stacking direction of the high-frequency signal line 10h is defined as the z-axis direction. Also, the longitudinal direction of the high-frequency signal line 10h is defined as the x-axis direction. A direction orthogonal to the x-axis direction and the z-axis direction is defined as the y-axis direction.

As shown in FIGS. 17 to 19, the high-frequency signal line 10h includes a dielectric element body 12, protection layers 14 and 15, a signal conductive layer 20, ground conductive layers 22, 23, 24, and 25, and via-hole conductors B101 to B108, B110 to B115, B120 to B123, and B131 to B134.

The dielectric element body 12 extends in the x-axis direction in plan view in the z-axis direction, and is a multilayer body preferably formed by stacking dielectric sheets (insulating layers) 18 (18a to 18d) in that order from the positive side to the negative side in the z-axis direction.

The dielectric element body 12 extends in the x-axis direction. As shown in FIGS. 18 and 19, the dielectric element body 12 includes regions A21 to A23, and A31 to A33. The regions A22, A21, and A23 are arranged in that order in the x-axis direction, and are adjacent to each other. The regions A32, A31, and A33 are arranged in that order in the x-axis direction, and are adjacent to each other.

Also, as shown in FIG. 17, the dielectric element body 12 is bent in a valley configuration in the region A21, and is bent in a mountain configuration in the region A31. Bending in a valley configuration represents that the principal surface at the positive side in the z-axis direction of the dielectric element body 12 is bent in a valley configuration. Bending in a mountain configuration represents that the principal surface at the positive side in the z-axis direction of the dielectric element body 12 is bent in a mountain configuration.

The signal conductive layer 20 includes line portions 20a to 20c. As shown in FIGS. 17 and 18, the line portion 20a is provided on the back surface of the dielectric sheet 18b, and extends in the x-axis direction. However, the line portion 20a is provided in the region A22.

As shown in FIGS. 17 and 18, the line portion 20b is provided on the back surface of the dielectric sheet 18c in the region A21, and extends in the x-axis direction.

As shown in FIGS. 17 to 19, the line portion 20c is provided on the back surface of the dielectric sheet 18b, and extends in the x-axis direction. However, the line portion 20c is provided in the regions A23, and A31 to A33.

The via-hole conductor B110 penetrates through the dielectric sheet 18c in the z-axis direction, and connects an end portion at the positive side in the x-axis direction of the line portion 20a with an end portion at the negative side in the x-axis direction of the line portion 20b. The via-hole conductor B111 penetrates through the dielectric sheet 18c in the z-axis direction, and connects an end portion at the positive side in the x-axis direction of the line portion 20b with an end portion at the negative side in the x-axis direction of the line portion 20c. Accordingly, the line portions 20a to 20c are connected, and the single signal conductive layer 20 is provided.

As shown in FIGS. 17 to 19, the ground conductive layer 22 is provided at the negative side in the z-axis direction with respect to the signal conductive layer 20 on the dielectric element body 12, and faces the signal conductive layer 20. To be more specific, the ground conductive layer 22 includes line portions 22e to 22g. As shown in FIGS. 17 and 18, the line portion 22e is provided on the back surface of the dielectric sheet 18d, and extends in the x-axis direction. However, the line portion 22e is provided in the region A22. Also, the line portion 22e is a conductive layer in a solid configuration. Hence, the line portion 22e does not have an opening at a position at which the line portion 22e overlaps the signal conductive layer 20.

As shown in FIGS. 17 and 18, the line portion 22f is provided on the back surface of the dielectric sheet 18d, and extends in the x-axis direction. However, the line portion 22f is provided in the regions A23 and A32. Also, the line portion 22f is a conductive layer in a solid configuration. Hence, the line portion 22f does not have an opening at a position at which the line portion 22f overlaps the signal conductive layer 20.

As shown in FIGS. 17 to 19, the line portion 22g is provided on the back surface of the dielectric sheet 18d, and extends in the x-axis direction. However, the line portion 22g is provided in the region A33. Also, the line portion 22g is a conductive layer in a solid configuration. Hence, the line portion 22g does not have an opening at a position at which the line portion 22g overlaps the signal conductive layer 20.

As shown in FIGS. 17 and 19, the ground conductive layer 23 is provided on the back surface of the dielectric sheet 18c, and extends in the x-axis direction. However, the ground conductive layer 23 is provided in the region A31. Hence, the ground conductive layer 23 is arranged closer to the signal conductive layer 20 as compared with the ground conductive layer 22. Also, the ground conductive layer 23 is a conductive layer in a solid configuration. Hence, the ground conductive layer 23 does not have an opening at a position at which the ground conductive layer 23 overlaps the signal conductive layer 20.

The via-hole conductors B120 penetrate through the dielectric sheet 18c in the z-axis direction. The via-hole conductors B121 penetrate through the dielectric sheet 18d in the z-axis direction. The via-hole conductors B120 and B121 are connected with each other and define a single via-hole conductor. The single via-hole conductor connects the line portion 22f with the ground conductive layer 23.

The via-hole conductors B122 penetrate through the dielectric sheet 18c in the z-axis direction. The via-hole conductors B123 penetrate through the dielectric sheet 18d in the z-axis direction. The via-hole conductors B122 and B123 are connected with each other and define a single via-hole conductor. The single via-hole conductor connects the line portion 22g with the ground conductive layer 23.

As shown in FIGS. 17 to 19, the ground conductive layer 24 is provided at the positive side in the z-axis direction with respect to the signal conductive layer 20 on the dielectric element body 12, and faces the signal conductive layer 20. To be more specific, the ground conductive layer 24 includes line portions 24e to 24g. As shown in FIGS. 17 and 18, the line portion 24e is provided on the front surface of the dielectric sheet 18a, and extends in the x-axis direction. However, the line portion 24e is provided in the region A22. Also, the line portion 24e has a plurality of openings 30, each having a rectangular or substantially rectangular shape with a long side extending in the x-axis direction. The plurality of openings 30 are arranged in line in the x-axis direction, and overlap the signal conductive layer 20 in plan view in the z-axis direction.

As shown in FIGS. 17 and 18, the line portion 24f is provided on the front surface of the dielectric sheet 18a, and extends in the x-axis direction. However, the line portion 24f is provided in the regions A23 and A32. Also, the line portion 24f has a plurality of openings 30, each having a rectangular or substantially rectangular shape with a long side extending in the x-axis direction. The plurality of openings 30 are arranged in line in the x-axis direction, and overlap the signal conductive layer 20 in plan view in the z-axis direction.

As shown in FIGS. 17 to 19, the line portion 24g is provided on the front surface of the dielectric sheet 18a, and extends in the x-axis direction. However, the line portion 24g is provided in the region A33. Also, the line portion 24g has a plurality of openings 30, each having a rectangular or substantially rectangular shape with a long side extending in the x-axis direction. The plurality of openings 30 are arranged in line in the x-axis direction, and overlap the signal conductive layer 20 in plan view in the z-axis direction.

As shown in FIGS. 17 and 18, the ground conductive layer 25 is provided on the back surface of the dielectric sheet 18b, and extends in the x-axis direction. However, the ground conductive layer 25 is provided in the region A21. Hence, the ground conductive layer 25 is arranged closer to the signal conductive layer 20 as compared with the ground conductive layer 24. Also, the ground conductive layer 25 is a conductive layer in a solid configuration. Hence, the ground conductive layer 25 does not have an opening at a position at which the ground conductive layer 25 overlaps the signal conductive layer 20.

The via-hole conductors B112 penetrate through the dielectric sheet 18a in the z-axis direction. The via-hole conductors B113 penetrate through the dielectric sheet 18b in the z-axis direction. The via-hole conductors B112 and B113 are connected with each other and define a single via-hole conductor. The single via-hole conductor connects the line portion 24e with the ground conductive layer 25.

The via-hole conductors B114 penetrate through the dielectric sheet 18a in the z-axis direction. The via-hole conductors B115 penetrate through the dielectric sheet 18b in the z-axis direction. The via-hole conductors B114 and B115 are connected with each other and define a single via-hole conductor. The single via-hole conductor connects the line portion 24f with the ground conductive layer 25.

The via-hole conductors B101 penetrate through the dielectric sheet 18a in the z-axis direction, and are provided at both sides in the y-axis direction of the signal conductive layer 20 to be evenly spaced in the x-axis direction in plan view in the z-axis direction. The via-hole conductors B102 penetrate through the dielectric sheet 18b in the z-axis direction, and are provided at both sides in the y-axis direction of the signal conductive layer 20 to be evenly spaced in the x-axis direction in plan view in the z-axis direction. The via-hole conductors B103 penetrate through the dielectric sheet 18c in the z-axis direction, and are provided at both sides in the y-axis direction of the signal conductive layer 20 to be evenly spaced in the x-axis direction in plan view in the z-axis direction. The via-hole conductors B104 penetrate through the dielectric sheet 18d in the z-axis direction, and are provided at both sides in the y-axis direction of the signal conductive layer 20 to be evenly spaced in the x-axis direction in plan view in the z-axis direction. The via-hole conductors B101 to B104 are connected with each other and define a single via-hole conductor. The single via-hole conductor connects the line portion 24e with the line portion 22e.

The via-hole conductors B105 penetrate through the dielectric sheet 18a in the z-axis direction, and are provided at both sides in the y-axis direction of the signal conductive layer 20 to be evenly spaced in plan view in the z-axis direction. The via-hole conductors B106 penetrate through the dielectric sheet 18b in the z-axis direction, and are provided at both sides in the y-axis direction of the signal conductive layer 20 to be evenly spaced in plan view in the z-axis direction. The via-hole conductors B107 penetrate through the dielectric sheet 18c in the z-axis direction, and are provided at both sides in the y-axis direction of the signal conductive layer 20 to be evenly spaced in plan view in the z-axis direction. The via-hole conductors B108 penetrate through the dielectric sheet 18d in the z-axis direction, and are provided at both sides in the y-axis direction of the signal conductive layer 20 to be evenly spaced in plan view in the z-axis direction. The via-hole conductors B105 to B108 are connected with each other and define a single via-hole conductor. The single via-hole conductor connects the line portion 24f with the line portion 22f.

The via-hole conductors B131 penetrate through the dielectric sheet 18a in the z-axis direction, and are provided at both sides in the y-axis direction of the signal conductive layer 20 to be evenly spaced in plan view in the z-axis direction. The via-hole conductors B132 penetrate through the dielectric sheet 18b in the z-axis direction, and are provided at both sides in the y-axis direction of the signal conductive layer 20 to be evenly spaced in plan view in the z-axis direction. The via-hole conductors B133 penetrate through the dielectric sheet 18c in the z-axis direction, and are provided at both sides in the y-axis direction of the signal conductive layer 20 to be evenly spaced in plan view in the z-axis direction. The via-hole conductors B134 penetrate through the dielectric sheet 18d in the z-axis direction, and are provided at both sides in the y-axis direction of the signal conductive layer 20 to be evenly spaced in plan view in the z-axis direction. The via-hole conductors B131 to B134 are connected with each other and define a single via-hole conductor. The single via-hole conductor connects the line portion 24g with the line portion 22g.

With the high-frequency signal line 10h configured as described above, the signal conductive layer 20 is sandwiched between the ground conductive layer 22 and the ground conductive layer 24 from both sides in the z-axis direction in the regions A22, A23, A32, and A33. Accordingly, the high-frequency signal line 10e has a triplate stripline structure.

In this case, as shown in FIG. 18, a distance G2 between the line portion 22e and the line portion 22f is larger than a distance G1 between the line portion 24e and the line portion 24f. Also, as shown in FIG. 19, a distance G3 between the line portion 24f and the line portion 24g is larger than a distance G4 between the line portion 22f and the line portion 22g.

The protection layer 14 is provided on the front surface of the dielectric sheet 18a, and covers the ground conductive layer 24. The protection layer 15 is provided on the back surface of the dielectric sheet 18d, and covers the ground conductive layer 22.

As shown in FIG. 17, the high-frequency signal line 10h configured as described above is used while being bent in the regions A21 and A31. Then, the back surface of the high-frequency signal line 10e (that is, the protection layer 15) is attached to a metal body 400 such as a battery pack.

With the high-frequency signal line 10h, a distance D1 between the ground conductive layer 23 and the signal conductive layer 20 in the region A31 is smaller than a distance D2 between the ground conductive layer 22 and the signal conductive layer in the regions A32 and A33. Accordingly, similarly to the high-frequency signal line 10, the high-frequency signal line 10e can be easily bent.

Also, if the high-frequency signal line 10h is bent in a valley configuration in the region A21, the ground conductive layer 22 is located at the outer periphery side with respect to the ground conductive layer 24. Therefore, in the high-frequency signal line 10e, the distance G2 between the line portion 22e and the line portion 22f is larger than the distance G1 between the line portion 24e and the line portion 24f. Accordingly, if the high-frequency signal line 10h is bent in a valley configuration in the region A21, the ground conductive layer 24 is less likely located in a bent portion of the high-frequency signal line 10e. Hence, the situation, in which the bending of the high-frequency signal line 10h is disturbed by the ground conductive layer 24, is prevented from occurring.

Also, if the high-frequency signal line 10h is bent in a mountain configuration in the region A31, the ground conductive layer 24 is located at the outer periphery side with respect to the ground conductive layer 22. Therefore, in the high-frequency signal line 10h, the distance G3 between the line portion 24f and the line portion 24g is larger than the distance G4 between the line portion 22f and the line portion 22g. Accordingly, if the high-frequency signal line 10h is bent in a mountain configuration in the region A31, the ground conductive layer 22 is less likely located in a bent portion of the high-frequency signal line 10h. Hence, the situation, in which the bending of the high-frequency signal line 10h is disturbed by the ground conductive layer 22, is prevented from occurring.

It is to be noted that any of the high-frequency signal lines 10, and 10a to 10h is not limited to a flat cable, and may be used as a high-frequency signal line for a RF circuit board, such as an antenna front end module.

As described above, preferred embodiments of the present invention is useful for the high-frequency signal line and the electronic device including the high-frequency signal line. In particular, preferred embodiments of the present invention is excellent in that the high-frequency signal line can be easily bent.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line, comprising:
    a multilayer body including a first region and a second region, and a plurality of flexible insulating layers stacked on each other;
    a signal conductive layer provided in or on the multilayer body;
    a first ground conductive layer provided in or on the multilayer body, and facing the signal conductive layer; and
    a second ground conductive layer provided in or on the multilayer body, a capacitance being generated between the second ground conductive layer and the signal conductive layer; wherein
    a distance between the first ground conductive layer and the signal conductive layer in the first region is smaller than a distance between the first ground conductive layer and the signal conductive layer in the second region;
    the multilayer body is bent in the first region; and
    the second ground conductive layer is not provided in at least a portion of the first region, and is separated into a plurality of separate planar conductive portions.

2. The high-frequency signal line according to claim 1, wherein a line width of the signal conductive layer in the first region is smaller than a line width of the signal conductive layer in the second region.

3. The high-frequency signal line according to claim 1, wherein the multilayer body is bent in the first region so that the first ground conductive layer is located at an inner periphery side with respect to the signal conductive layer.

4. The high-frequency signal line according to claim 1, wherein the second ground conductive layer includes a plurality of openings arranged along the signal conductive layer.

5. The high-frequency signal line according to claim 1, wherein
    a length of the portion of the first region not provided with the second ground conductive layer is smaller than a length of the first ground conductive layer in the first region; and
    the multilayer body is bent in the first region so that the first ground conductive layer is located at an inner periphery side with respect to the signal conductive layer.

6. The high-frequency signal line according to claim 1, wherein a thickness of the multilayer body in at least a portion of the first region is smaller than a thickness of the multilayer body in the second region.

7. The high-frequency signal line according to claim 6, wherein the insulating layers located at an opposite side of the first ground conductive layer with respect to the signal conductive layer are not provided in at least a portion of the first region.

8. The high-frequency signal line according to claim 1, wherein the multilayer body includes:
    a line unit including the first region and the second region; and
    a connection unit connected with an end portion of the line unit; wherein
    the first region is adjacent to the connection unit.

9. The high-frequency signal line according to claim 8, wherein
    a distance between the signal conductive layer and the first ground conductive layer is larger than a distance between the signal conductive layer and the second ground conductive layer; and
    a portion of the insulating layers provided at a side of the first ground conductive layer with respect to the signal conductive layer is not provided.

10. The high-frequency signal line according to claim 9, wherein the second ground conductive layer includes a plurality of openings arranged along the signal conductive layer.

11. An electronic device, comprising:
    a high-frequency signal line; and
    a casing; wherein
    the high-frequency signal line includes:
        a multilayer body including a first region and a second region, and a plurality of flexible insulating layers stacked on each other;

a signal conductive layer provided in or on the multilayer body;

a first ground conductive layer provided in or on the multilayer body, and facing the signal conductive layer; and a second ground conductive layer provided in or on the multilayer body, a capacitance being generated between the second ground conductive layer and the signal conductive layer; wherein a distance between the first ground conductive layer and the signal conductive layer in the first region is smaller than a distance between the first ground conductive layer and the signal conductive layer in the second region;

the multilayer body is bent in the first region in the casing; and the second ground conductive layer is not provided in at least a portion of the first region, and is separated into a plurality of separate planar conductive portions.

12. The electronic device according to claim 11, wherein a line width of the signal conductive layer in the first region is smaller than a line width of the signal conductive layer in the second region.

13. The electronic device according to claim 11, wherein the multilayer body is bent in the first region so that the first ground conductive layer is located at an inner periphery side with respect to the signal conductive layer.

14. The electronic device according to claim 11, wherein the second ground conductive layer includes a plurality of openings arranged along the signal conductive layer.

15. The electronic device according to claim 11, wherein a thickness of the multilayer body in at least a portion of the first region is smaller than a thickness of the multilayer body in the second region.

16. The electronic device according to claim 15, wherein the insulating layers located at an opposite side of the first ground conductive layer with respect to the signal conductive layer are not provided in at least a portion of the first region.

17. A high-frequency signal line, comprising:

a multilayer body including a first region and a second region, and a plurality of flexible insulating layers stacked on each other;

a signal conductive layer provided in or on the multilayer body;

a first ground conductive layer provided in or on the multilayer body, and facing the signal conductive layer; and a second ground conductive layer provided in or on the multilayer body, a capacitance being generated between the second ground conductive layer and the signal conductive layer; wherein a distance between the first ground conductive layer and the signal conductive layer in the first region is smaller than a distance between the first ground conductive layer and the signal conductive layer in the second region;

the multilayer body is bent in the first region;

the multilayer body includes:

a line unit including the first region and the second region; and a connection unit connected with an end portion of the line unit; wherein the first region is adjacent to the connection unit;

a distance between the signal conductive layer and the first ground conductive layer is larger than a distance between the signal conductive layer and the second ground conductive layer; and a portion of the insulating layers provided at a side of the first ground conductive layer with respect to the signal conductive layer is not provided.

18. An electronic device, comprising:

a high-frequency signal line; and a casing; wherein the high-frequency signal line includes:

a multilayer body including a first region and a second region, and a plurality of flexible insulating layers stacked on each other;

a signal conductive layer provided in or on the multilayer body;

a first ground conductive layer provided in or on the multilayer body, and facing the signal conductive layer; and a second ground conductive layer provided in or on the multilayer body, a capacitance being generated between the second ground conductive layer and the signal conductive layer; wherein a distance between the first ground conductive layer and the signal conductive layer in the first region is smaller than a distance between the first ground conductive layer and the signal conductive layer in the second region;

the multilayer body is bent in the first region;

the multilayer body includes:

a line unit including the first region and the second region; and a connection unit connected with an end portion of the line unit; wherein the first region is adjacent to the connection unit;

a distance between the signal conductive layer and the first ground conductive layer is larger than a distance between the signal conductive layer and the second ground conductive layer; and a portion of the insulating layers provided at a side of the first ground conductive layer with respect to the signal conductive layer is not provided.

* * * * *